United States Patent [19]
Beeson et al.

[11] Patent Number: 5,462,700
[45] Date of Patent: Oct. 31, 1995

[54] PROCESS FOR MAKING AN ARRAY OF TAPERED PHOTOPOLYMERIZED WAVEGUIDES

[75] Inventors: Karl W. Beeson, Mercer; Scott M. Zimmerman; Paul M. Ferm, both of Morris; Michael J. McFarland, Warren, all of N.J.

[73] Assignee: AlliedSignal Inc., Morristown, N.J.

[21] Appl. No.: 148,794

[22] Filed: Nov. 8, 1993

[51] Int. Cl.⁶ ........................................ B29D 11/00
[52] U.S. Cl. ................. 264/1.27; 264/1.38; 264/2.6; 362/32; 385/146
[58] Field of Search ............... 264/22, 1.27, 1.38, 264/2.6; 385/129, 132, 146; 362/32

[56] References Cited

U.S. PATENT DOCUMENTS

| | | |
|---|---|---|
| 3,218,924 | 11/1965 | Miller . |
| 3,279,314 | 10/1966 | Miller . |
| 3,767,445 | 10/1973 | Chandross et al. . |
| 4,101,324 | 7/1978 | Mizuno et al. . |
| 4,115,119 | 9/1978 | Okai et al. . |
| 4,640,736 | 2/1987 | Holman . |
| 4,712,854 | 12/1987 | Mikami et al. . |
| 4,767,186 | 8/1988 | Bradley, Jr. et al. . |
| 4,783,136 | 11/1988 | Elman et al. . |
| 4,886,538 | 12/1989 | Mahapatra .................. 264/1.4 |
| 4,902,086 | 2/1990 | Henry et al. . |
| 5,113,471 | 5/1992 | Inaishi et al. . |
| 5,136,678 | 8/1992 | Yoshimura . |
| 5,137,800 | 8/1992 | Neckers et al. . |
| 5,138,687 | 8/1992 | Horie et al. . |
| 5,230,990 | 7/1993 | Iwasaki et al. . |

FOREIGN PATENT DOCUMENTS

| | | |
|---|---|---|
| 357396 | 3/1990 | European Pat. Off. . |
| 0459252 | 12/1991 | European Pat. Off. . |
| 57-128301 | 8/1982 | Japan . |
| 61-53031 | 3/1986 | Japan ............................ 264/1.4 |
| 61-42241 | 9/1986 | Japan . |
| 245106 | 10/1991 | Japan . |
| 5024121 | 2/1993 | Japan . |
| 5119203 | 5/1993 | Japan . |
| 2136150 | 9/1984 | United Kingdom . |

OTHER PUBLICATIONS

Database Tech Discl. Bull, International Business Machines, Armonk, U.S. vol. 28, No. 11, Apr. 1986, Anaon. "Dyed Resist to Enhance Undercut Angles Attainable on Reduction Projection Printers".

J. Sturge et al., Ed. "Imaging Processes and Materials, Neblette's 8th Edition" 1989, Van Nostrand Reinhold, New York Chapter 16 p. 466–p. 473.

Primary Examiner—Mathieu D. Vargot
Attorney, Agent, or Firm—Roger H. Criss; Melanie L. Brown

[57] ABSTRACT

The present invention is directed to a process for making an array of tapered photopolymerized waveguides. A photomask having opaque and transparent regions is placed in substantial contact with a substrate having a substantially uniform thickness of photopolymerizable mixture thereon. The photopolymerizable mixture is then exposed through the transparent regions of the photomask to substantially collimated actinic radiation for a time sufficient to form an array of tapered photopolymerized waveguides. The photomask and photopolymerizable mixture which was not substantially polymerized by the substantially collimated actinic radiation are then removed from the substrate. The tapered waveguides are useful as a display means in direct view devices and projection display devices.

20 Claims, 11 Drawing Sheets

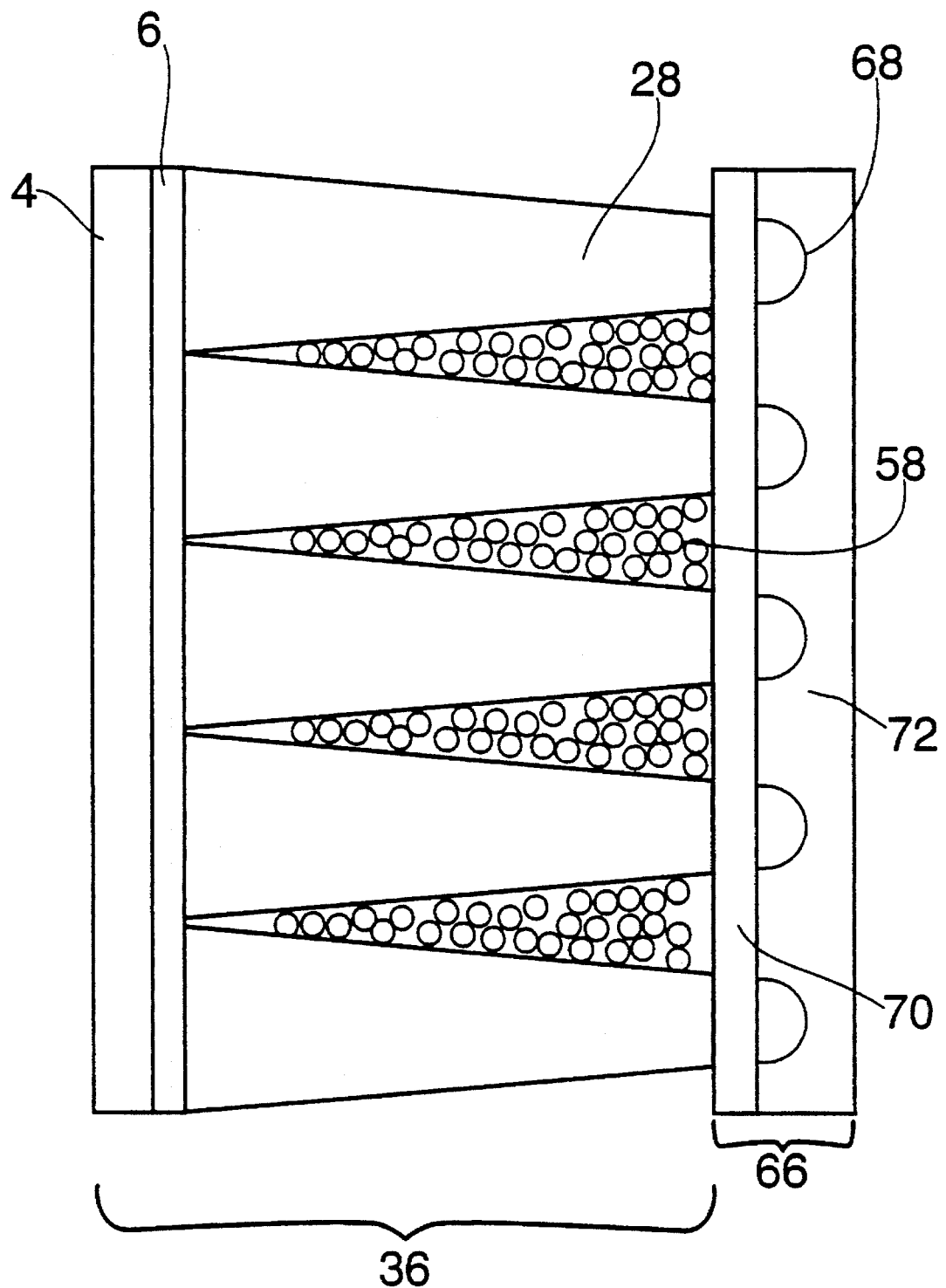

PROCESS FOR MAKING AN ARRAY OF TAPERED PHOTOPOLYMERIZED WAVEGUIDES

BACKGROUND OF THE INVENTION

The present invention relates to a process for making an array of tapered photopolymerized waveguides.

Waveguides, also known in the art as light transmissive devices or lightguides, are used in display devices, such as for example projection display devices, off screen display devices, and direct view displays. See for example U.S. Pat. No. 3,218,924 and U.S. Pat. No. 3,279,314 to Miller and U.S. Pat. No. 4,767,186 to Bradley, Jr. et al. Such displays are used in a wide range of applications including computer terminals, airplane cockpit displays, automotive instrument panels, televisions, and other devices that provide text, graphics, or video information.

Processes for making waveguides for use in display devices are known. For example, U.S. Pat. Nos. 3,218,924; 3,279,314; and U.S. Pat. No. 4,767,186 teach that projection screens may be manufactured by known processes and list compression molding, rejection molding, extrusion, hot roller pressing, casting, and photopolymerization. U.S. Pat. No. 3,767,445 teaches a method for producing integrated optical waveguides by making a die having a surface matching the desired uniform cross section waveguide shape, embossing a transparent plastic substrate with the die, and coating the embossed substrate with a high refractive index material.

U.S. Pat. No. 5,230,990 teaches a process for making an optical waveguide array of light transmissive cores with uniform cross section throughout the core length. A resist master is formed first by exposing a photoresist layer through a photomask, dissolving the exposed areas, and heating the non-exposed areas to form parallel rows of semicircular shaped protuberances. The resist is heated until it is melted and the liquid surface tension draws it into a line of a semicircular cross section or a hemispherical bead. Thus, semicircular grooves and hemispherical dots are the only shapes attainable with this method. A stamper is then formed from the resist master by sputtering an electroconductive film on the resist master to form a metal master and then forming a metallic film on the metal master to form a stamper having parallel rows of semicircular shaped protuberances. The stamper is then used to form the optical waveguide array by exposing a low refractive index material on the stamper, removing the cured layer, putting a high refractive index material into the semicircular shaped grooves of the cured layer, curing the high refractive index, putting a low refractive material on the high refractive index material, and curing. See also U.S. Pat. Nos. 4,902,086; 5,113,471; and 5,136,678.

Kokai Patent Publication 245106 published Oct. 31, 1991 teaches a process of making an optical plate of a substrate having high refractive index waveguides with uniform cross section throughout the waveguide length, wherein the waveguides are separated by low refractive index material. The optical plate is made by placing high refractive index photosensitive resin on a substrate, coveting the photosensitive resin with a low oxygen permeable sheet, and exposing the photosensitive resin to ultraviolet light through a photomask and the low oxygen permeable sheet to form uniform cross section waveguides. The unexposed resin and low oxygen permeable sheet are removed and low refractive index material is placed around the waveguides.

The 245106 process is disadvantageous because it produces waveguides which when used on a display, would suffer from low contrast and changes in visual chromaticity as the viewing angle changes. In order to obtain good collection of light at the input end of the waveguides, they must be close packed at the input end, as taught in Kokai 245106. Since the cross-section is uniform, this close packed arrangement persists throughout the optical plate, along the length of the waveguides. This results in difficulty in removing the unexposed material from the wall area during the development step and additionally, does not provide space on the output end of the plate for contrast improving materials to be added. Moreover, waveguides with uniform cross section do not increase the angular distribution of the light which passes through them. It is often highly desirable that the waveguides should cause such an increase in angular distribution as is taught in commonly assigned U.S. patent application Ser. No. 86,414 filed Jul. 1, 1993.

Other processes for making optical waveguides having uniform cross section are disclosed in U.S. Pat. Nos. 4,783,136 and 5,138,687; European Patent Publication 357396 published Mar. 7, 1990; Kokai Patent Publication 24121 published Feb. 2, 1993; and Kokai Patent Publication 119203 published May 18, 1993.

U.S. Pat. No. 4,712,854 teaches two processes for forming optical waveguides suitable for connection to optical fibers. The first process involves a first ultraviolet light exposure step to form a refractive index profile in the depthwise direction of the photopolymerization material and a second ultraviolet light exposure step to form a refractive index profile in the widthwise direction to form an optical waveguide having good matching characteristics relative to a graded index type optical fiber. This process is disadvantageous because two ultraviolet light exposure steps are required. In addition, no relief image is formed and the waveguide consists of a higher refractive index region within a sheet of continuous polymer film, or a lamination of several of such films. Optical waveguide propagation is therefore strictly limited to the plane of the film, never to propagation normal to the film surface.

Kokai Patent Publication 42241 published Sep. 19, 1986 teaches a process of making a lightguide array by moving a substrate through a container of monomer solution while exposing the solution to ultraviolet light through a photomask so that uniform cross section lightguide bodies form on the substrate. During the process, the monomer solution being exposed is positioned between the photomask and substrate and the photomask is positioned between the ultraviolet light and the monomer solution. During the exposure, the substrate is moved perpendicularly away from the light source. The substrate is then removed from the container and a lower refractive index material is poured around the rod-shaped lightguide bodies and cured. Tapered lightguide bodies are formed by positioning a lens between the photomask and monomer solution and moving the lens, thereby altering the mask image magnification, so that the lightguide bodies taper in a direction away from the substrate toward the lens, photomask, and ultraviolet light. The complicated moving mask and lens system makes this process disadvantageous to use. Also, this process is incapable of making tapered lightguide bodies wherein the center-to-center distance between light input surfaces of adjacent bodies is substantially equal to the center-to-center distance between light output surfaces thereof. As a result, the area of the input and output surfaces of the array cannot be equal. The array area at the tapered end is decreased by the square of the reduction ratio of the individual elements, as is clear from the diagrams of Kokai 42241. This method is therefore of no use for creating tapered waveguide arrays for use in display applications such as liquid crystal displays (LCD's), as it is highly undesirable to shrink the size of the display. Further, the cross sections of individual elements in an array created by a moving lens are not uniform. Those which are close to the optical axis of the lens system have a different cross-sectional profile than those lying at the perimeter of the array. This effect is also clearly shown in the diagrams of Kokai 42241. As a result, the individual elements of the array will have nonuniform optical properties, which is highly undesirable in display systems where such nonuniformities would degrade the image qualities.

As such, the need exists in the art for a simple process for making an array of tapered photopolymerized waveguides wherein the array of tapered photopolymerized waveguides has improved properties.

SUMMARY OF THE INVENTION

We have developed a process for making an array of tapered photopolymerized waveguides which responds to the foregoing need in the art. In step (a), a photomask is placed in substantial contact with a substrate wherein the photomask has opaque and transparent regions. In step (b), a substantially uniform thickness of photopolymerizable mixture is placed on the substrate so that the substrate is positioned between the photopolymerizable mixture and the photomask wherein (i) the photopolymerizable mixture comprises at least one reactive monomer and photoinitiator and (ii) the photoinitiator is present in an amount sufficient to form a gradient of substantially collimated actinic radiation across the thickness of the photopolymerizable mixture during subsequent step (c). In step (c), while maintaining the photopolymerizable mixture and substrate in a substantially fixed plane relative to the substantially collimated actinic radiation, the photopolymerizable mixture is exposed through the transparent regions of the photomask to the substantially collimated actinic radiation for a time sufficient to form an array of tapered photopolymerized waveguides wherein (i) the tapered end of each of the waveguides extends outward from the substrate, (ii) each of the waveguides has a light input surface adjacent the substrate and a light output surface distal from the light input surface, and (iii) the area of the light input surface of each of the waveguides is greater than the area of its light output surface. In step (d), the photomask and photopolymerizable mixture which was not substantially polymerized by the substantially collimated actinic radiation during step (c) are removed from the substrate.

In another embodiment, in step (a), a substantially uniform thickness of photopolymerizable mixture is placed on a photomask wherein (i) the photomask has opaque and transparent regions, (ii) the photopolymerizable mixture comprises at least one reactive monomer and photoinitiator, and (iii) the photoinitiator is present in an mount sufficient to form a gradient of substantially collimated actinic radiation across the thickness of the photopolymerizable mixture during subsequent step (b). In step (b), while maintaining the photopolymerizable mixture and photomask in a substantially fixed plane relative to the substantially collimated actinic radiation, photopolymerizable mixture is exposed through the transparent regions of the photomask to the substantially collimated actinic radiation for a time sufficient to form an array of tapered photopolymerized waveguides wherein (i) the tapered end of each of the waveguides extends outward from the photomask, (ii) each of the waveguides has a light input surface adjacent the photomask and a light output surface distal from the light input surface, and (iii) the area of the light input surface of each of the waveguides is greater than the area of its light output surface. In step (c), photopolymerizable mixture which was not substantially polymerized by the substantially collimated actinic radiation during step (b) is removed from the photomask.

Unlike the process of Kokai Patent Publication 42241, the present process is advantageous because it does not require movement of the photopolymerizable mixture during the exposure step or a complicated lens system in order to make tapered lightguides. More importantly, the area of the input and output surfaces of an array of such tapered waveguides is substantially unchanged and is largely independent of the degree of taper of the individual waveguides. Additionally, each individual waveguide is substantially identical regardless of its position within the array which results in uniform optical properties across the array.

Other advantages of the present invention will be apparent from the following description, attached drawings, and attached claims.

BRIEF DESCRIPTION OF THE DRAWINGS

FIG. 18 shows an array of tapered waveguides made by the present process wherein the output faces of the waveguide array are covered by a transparent protective layer incorporating an array of lenses.

DESCRIPTION OF THE PREFERRED EMBODIMENTS

The preferred embodiments of this invention will be better understood by those of skill in the art by reference to the above Figures. The preferred embodiments of this invention illustrated in the Figures are not intended to be exhaustive or to limit the invention to the precise form disclosed. The Figures are chosen to describe or to best explain the principles of the invention, and its application and practical use to thereby enable others skilled in the art to best utilize the invention.

Figure 1:
FIG. 1 shows a substrate useful in practicing the present process.

A waveguide substrate 2 as illustrated in FIG. 1 is useful in practicing the present process. Waveguide substrate 2 comprises substrate 4 and an optional adhesion promoting layer 6. At a minimum, substrate 4 is transparent to light within the wavelength range from about 400 to about 700 nm, as this visible wavelength region is the most desirable region in which the optical waveguides to be formed will operate. It is more preferred that the substrate 4 also transmits ultraviolet light in the region from about 250 to about 400 nm as this is the region in which many useful photoinitiators absorb light. Additionally, if it is desired to utilize the tapered waveguide array in the near infrared region, from about 700 nm to about 2000 nm, then it would be preferred to use a substrate 4 which is transparent in that region as well. The index of refraction of substrate 4 may range from about 1.45 to about 1.65. The most preferred index of refraction is from about 1.50 to about 1.60. Substrate 4 may be made from any transparent solid material. Preferred materials are commercially available and include transparent polymers, glass, and fused silica. Useful transparent polymers include polyesters, polyacrylates and methacrylates, polystyrene, and polycarbonates. Desired characteristics of these materials include mechanical and optical stability at typical operating temperatures of the display device. Compared with glass, transparent polymers have the added advantage of structural flexibility which allows products to be formed in large sheets and then cut and laminated as necessary. The preferred materials for substrate 4 are glass and polyester such as polyethylene terephthalate. The thickness of substrate 4 may vary widely. Preferably, the thickness of substrate 4 is about 1 mil (0.001 inch or 25 microns) to about 10 mil (0.01 inch or 250 microns).

Preferably, the adhesion promoting layer 6 is an organic material which is light transmissive and causes the waveguides to be formed thereon, especially waveguides formed from polymers as for example photocrosslinked acrylate monomer materials, to adhere strongly to substrate 4. Such materials are well known to those skilled in the art, are commercially available, and will not be described herein in great detail. For example, if substrate 4 is glass and waveguides are formed from acrylate monomer materials, then an appropriate adhesion promoting layer 6 may be formed by reacting the glass surface with certain types of silane compounds including 3-(trimethoxysilyl)propyl methacrylate; 3-acryloxypropyl trichlorosilane; and trimethylsilylpropylmethacrylate. If substrate 4 is polyethylene terephthalate (PET) and waveguides are formed from acrylate monomer materials for example, adhesion promoting layer 6 may be provided by using an adhesion treated PET film such as Hostaphan 4500 (Hoechst-Celanese). If substrate 4 is emulsion coated and the waveguides are formed from acrylate monomer materials for example, adhesion promoting layer 6 may be formed from 3-acryloxypropyltrichlorosilane (Hüls America A0396). The thickness of adhesion promotion layer 6 may vary widely. Usually, the thickness of adhesion promoting layer 6 is as used in the end application such as conventional direct view flat panel display devices. In the preferred embodiments of the invention, adhesion promoting layer 6 is less than about 1 micrometer thick. If it is determined that adhesion of the s waveguides to a bare substrate 4 is sufficient, then adhesion layer 6 may be omitted.

Figure 2:
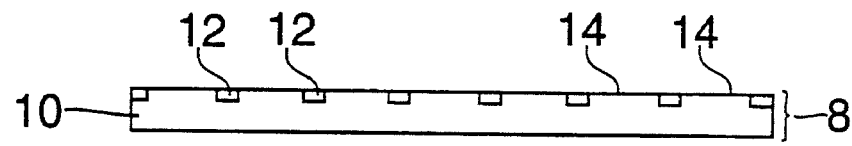
FIG. 2 shows a side view of a photomask useful in practicing the present process.
Figure 2A:
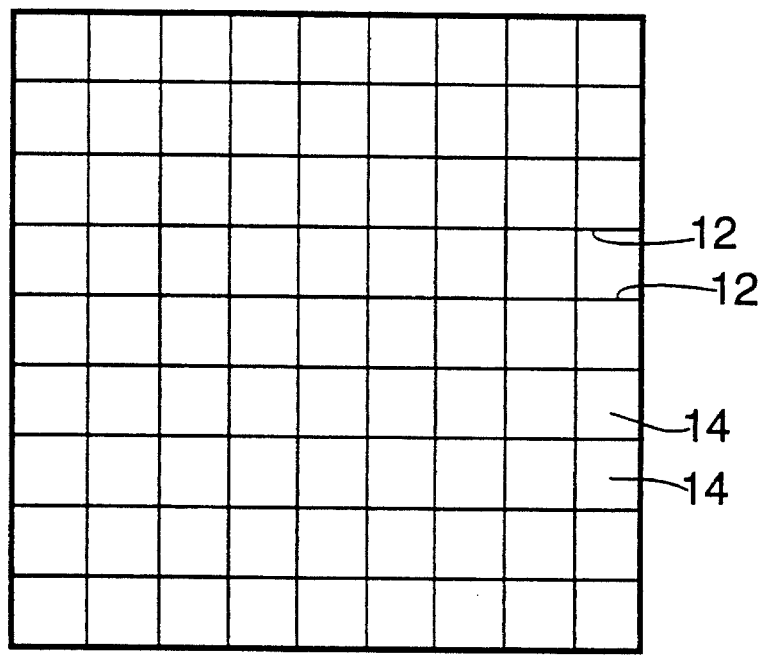
FIG. 2A shows a top view of the photomask.

A photomask 8 as illustrated in FIG. 2 is useful in practicing the present process. Photomask 8 controls the spatial profile of the ultraviolet light, that is, where it falls upon the layer of photopolymerizable material. Photomask 8 comprises transparent substrate 10 which has opaque regions 12 and transparent regions 14 on one surface which allow radiation directed at photomask 8 to fall only on the desired regions of photopolymerizable material. As shown in FIG. 2A, photomask 8 has a pattern of opaque regions 12 and s transparent regions 14 which comprise the desired pattern of the array of tapered waveguides. The pattern in FIG. 2A is one of many useful patterns and is intended to be illustrative only. Many other patterns of transparent and opaque regions are useful within the scope of the present invention. Commercially available photomasks are useful in the present process.

Figure 3:
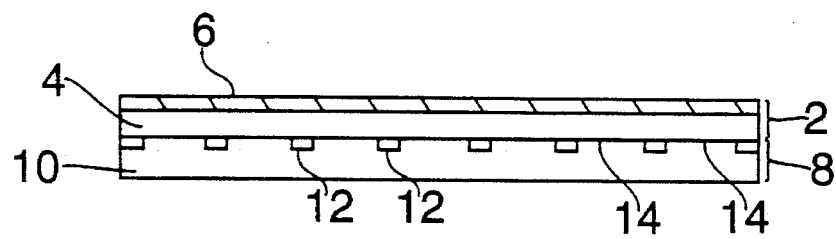
FIG. 3 shows the combination of the substrate of FIG. 1 and the photomask of FIG. 2.

In the first step of one embodiment of the present invention, photomask 8 is placed in substantial contact with waveguide substrate 2 as illustrated in FIG. 3. As used herein, the term "substantial contact" means that the photomask 8 and waveguide substrate 2 do not become separated during the remainder of the present process. Any known method for maintaining substantial contact between two substrates may be used herein. For example, a liquid such as isopropanol, methanol, or water may be placed between photomask 8 and waveguide substrate 2 and then a rubber roller may be used to press photomask 8 and waveguide substrate 2 together. Other known methods for maintaining substantial contact between two substrates include mechanical fixturing, vacuum contact, static contact and others which enable off-contact or proximity printing, soft-contact printing, and scanning.

In the second step of the first embodiment of the present invention, a substantially uniform thickness of a photopolymerizable mixture is placed on the waveguide substrate so that the waveguide substrate is positioned between the photopolymerizable mixture and the photomask wherein the photopolymerizable mixture comprises a reactive monomer, or mixture of such monomers, and photoinitiator, or mixture of such photoinitiators, and the photoinitiator is present in an amount sufficient to form a gradient of substantially collimated ultraviolet light across the thickness of the photopolymerizable mixture during a subsequent step. Any known method for placing a substantially uniform thickness of a photopolymerizable material on a substrate may be used in the present process. As used herein, the term "substantially uniform thickness" means less than about 10 percent variation in thickness across the area of the mixture, and more preferably less than about 5 percent variation in thickness. As will be explained in more detail later, the thickness of photopolymerizable mixture is the desired final length of a photopolymerized tapered waveguide which, in turn, is determined by the minimum transverse distance across the waveguide input surface. Preferably, the length of a photopolymerized tapered waveguide or the thickness of photopolymerizable mixture is from about 1 to about 4000 microns, more preferably from about 15 to about 1600 microns, and most preferably from about 50 to about 400 microns.

Figure 4:
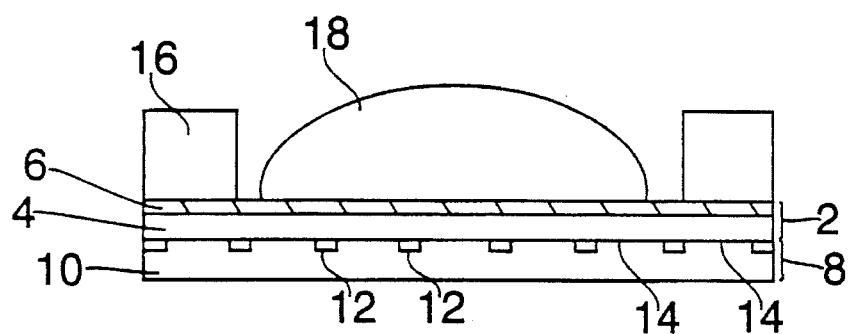
FIG. 4 shows the FIG. 3 combination with a photopolymerizable material useful in practicing the present process.
Figure 5:
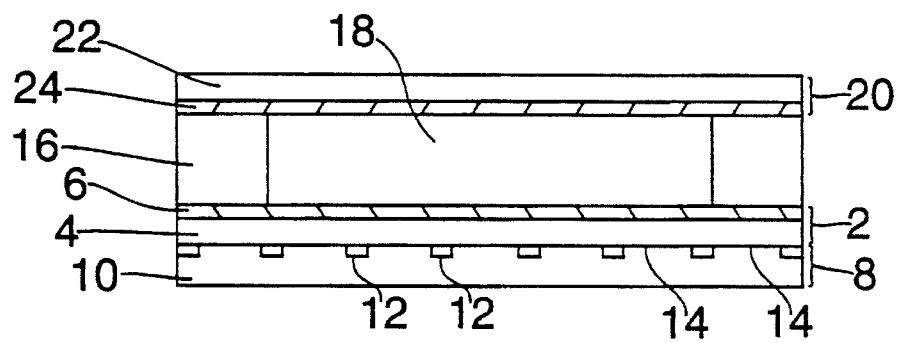
FIG. 5 shows FIG. 4 with a cover plate useful in practicing the present process.

Methods for placing a substantially uniform thickness of photopolymerizable material include spin coating, roller coating, doctor blading, patch coating using a slot, extrusion coating, and the like. FIG. 4 and 5 illustrate another method. Spacers 16 are positioned on waveguide substrate 2. The height of spacers 16 is the desired final length of the photopolymerized tapered waveguide. Photopolymerizable mixture 18 is then placed on waveguide substrate 2 so that waveguide substrate 2 is positioned between photopolymerizable mixture 18 and the photomask 8.

Photopolymerizable material 18 comprises two essential ingredients. The first essential ingredient is a photopolymerizable monomer, especially an ethylenically unsaturated monomer which will provide a transparent solid polymer material. Preferred solid polymer materials have an index of refraction between about 1.45 and about 1.65 and include commercially available polymethylmethacrylate, polycarbonate, polyester, polystyrene, and polymers formed by photopolymerization of acrylate or methacrylate monomers. More preferred materials have an index of refraction between about 1.50 and about 1.60 and include polymers formed by photopolymerization of acrylate monomer mixtures composed of urethane acrylates and methacrylates, ester acrylates and methacrylates, epoxy acrylates and methacrylates, (poly) ethylene glycol acrylates and methacrylates and vinyl containing organic monomers. It is useful to utilize a mixture of monomers in the photopolymerizable mixture in order to fine tone the properties of the composition such as to fine tone crosslinking density, viscosity, adhesion, curing rate, and refractive index and to reduce discoloration, cracking, and delamination properties of the photopolymer formed from the composition.

Examples of useful more preferred monomers include methyl methacrylate; n-butyl acrylate (BA); 2-ethylhexyl acrylate (EHA); isodecyl acrylate; 2-hydroxyethyl acrylate; 2-hydroxypropyl acrylate; cyclohexyl acrylate (CHA); 1,4-butanediol diacrylate; ethoxylated bisphenol A diacrylate; neopentylglycol diacrylate (NPGDA); diethyleneglycol diacrylate (DEGDA); diethylene glycol dimethacrylate (PEGDMA); 1,6-hexanediol diacrylate (HDDA); trimethylol propane triacrylate (TMPTA); pentaerythritol triacrylate (PETA); pentaerythritol tetra-acrylate (PETTA); phenoxyethyl acrylate (PEA); β -carboxylethyl acrylate (β-CEA); isobornyl acrylate (IBOA); tetrahydrofurfuryl acrylate (THFFA); propylene glycol monoacrylate (MPPGA); 2-(2-ethoxyethoxy) ethyl acrylate (EOEOEA); N-vinyl pyrrolidone (NVP); 1,6-hexanediol dimethacrylate (HDDMA); triethylene glycol diacrylate (TEGDA) or dimethacrylate (TEGDMA); tetraethylene glycol diacrylate (TTEGDA) or dimethacrylate (TTEGDMA); polyethylene glycol diacrylate (PEGDA) or dimethacrylate (PEGDMA); dipropylene glycol diacrylate (DPGDA); tripropylene glycol diacrylate (TPGDA); ethoxylated neopentyl glycol diacrylate (NPEOGDA); propoxylated neopentyl glycol diacrylate (NPPOGDA); aliphatic diacrylate (ADA); alkoxylated aliphatic diacrylate (AADA); aliphatic carbonate diacrylate (ACDA); trimethylolpropane trimethacrylate (TMPTMA); ethoxylated trimethylolpropane triacrylate (TMPEOTA); propoxylated trimethylolpropane triacrylate (TMPPOTA); glyceryl proxylated triacrylate (GPTA); tris (2-hydroxyethyl) isocyanurate triacrylate (THEICTA); dipentaerythritol pentaacrylate (DPEPA); ditrimethylolpropane tetraacrylate (DTMPTTA); and alkoxylated tetraacrylate (ATTA).

Especially useful are mixtures wherein at least one monomer is a multifunctional monomer such as a diacrylate or triacrylate, as these will produce a network of crosslinks within the reacted photopolymer. The most preferred materials for use in the method of the invention are crosslinked polymers formed by photopolymerizing mixtures of ethoxylated bisphenol A diacrylate and trimethylol propane triacrylate. The index of refraction of the most preferred materials ranges from about 1.53 to about 1.56. It is not essential that the refractive index of the transparent solid material be homogeneous throughout the waveguide element. It may be advantageous to cause to be present, inhomogeneities in refractive index, such as striations or scattering particles or domains, as these inhomogeneities may further increase the divergence of light from the output of the waveguide array.

The amount of monomer in photopolymerizable material may vary widely. The amount of monomer or the total amount of a mixture of monomers is usually from about 60 to about 99.8 percent by weight of the photopolymerizable material, preferably from about 80 to about 99 percent by weight of the photopolymerizable material, and more preferably from about 85 to about 99 percent by weight of the photopolymerizable material.

As another essential component, the polymerizable material 18 includes a photoinitiator which is activated by actinic radiation to produce activated species which lead to photopolymerization of the monomer. The photoinitiator system will contain a photoinitiator and preferably a conventional sensitizer which extends the spectral response into regions having spectral utility, e.g. the near ultraviolet region and the visible spectral regions where lasers excite and where many common optical materials are transmissive. Usually the photoinitiator is a free radical-generating addition polymerization initiator activated by actinic light and is preferably thermally inactive at and below room temperature (e.g. about 20° C. to about 25° C.)

Illustrative of such initiators are those described in U.S. Pat. No. 4,943,112 and references cited therein. Preferred free radical initiators are 1-hydroxy-cyclohexyl-phenyl ketone (Irgacure 184); benzoin; benzoin ethyl ether; benzoin isopropyl ether; benzophenone; benzidimethyl ketal (Irgacure 651); α,α-diethyloxy acetophenone, α,α-dimethyloxy-α-hydroxy acetophenone (Darocur 1173); 1-[4-(2-hydroxyethoxy)phenyl] -2-hydroxy-2-methyl-propan-1-one (Darocur 2959); 2-methyl-1-[4-methylthio)phenyl]-2-morpholino-propan-1-one (Irgacure 907); 2-benzyl-2-dimethylamino-1-(4-morpholinophenyl) -butan-1-one (Irgacure 369); poly{1-[4-(1-methylvinyl)phenyl]-2 -hydroxy-2-methyl-propan-1-one} (Esacure KIP); [4-(4 -methylphenylthio)-phenyl]phenylmethanone (Quantacure BMS); dicampherquinone; and 50% 1-hydroxycyclohexyl phenyl ketone and 50% benzophenone (Irgacure 500).

The more preferred photoinitiators includes benzidimethyl ketal (Irgacure 651); α,α-diethyloxy acetophenone; α,α-dimethyloxy-α-hydroxy acetophenone (Darocur 1173); 1-hydroxy-cyclohexyl-phenyl ketone (Irgacure 184); 1-[4-(2-hydroxyethoxy)phenyl]-2-hydroxy-2 -methyl-propan-1-one (Darocur 2959); 2-methyl-1-4(methylthio)phenyl] -2-morpholino-propan-1-one (Irgacure 907); 2 -benzyl-2- dimethylamino-1-(4-morpholinophenyl)butan-1-one (Irgacure 369); and 50% 1-hydroxycyclohexyl phenyl ketone and 50% benzophenone (Irgacure 500). The most preferred photoinitiators are those which tend not to yellow upon irradiation and, thus, do not increase the coloration of the composition on the Gardner scale to a value of greater than 8 points on exposure to a temperature of 190° C. for 24 hours as determined by ASTM D 1544-80. Such photoinitiators include benzidimethyl ketal (Irgacure 651); α,α-dimethyloxy-a-hydroxy acetophenone (Darocur 1173); 1-hydroxycyclohexyl-phenyl ketone (Irgacure-184); 1-[4-(2-hydroxyethoxy)phenyl]-2-hydroxy-2 -methyl-propan-1-one (Darocur 2959); and 50% 1-hydroxycyclohexyl phenyl ketone and 50% benzophenone (Irgacure 500).

The amount of photoinitiator which must be present to form a gradient of substantially collimated ultraviolet light across the thickness of the photopolymerizable mixture 18 during a subsequent step is from about 0.1 to about 12 percent by weight based on the total weight of the photopolymerizable material. The amount of photoinitiator is preferably from about 0.5 to about 12 percent by weight, and more preferably from about 0.5 to about 8 percent by weight based on the total weight of the photopolymerizable material. It is realized that the desired gradient will be influenced not only by the concentration of the initiator but by the choice of irradiating wavelengths present in the exposure source, which may be controlled by those skilled in the art.

In addition to the essential ingredients, the photopolymerizable material may include various optional ingredients such as stabilizers, inhibitors, plasticizers, optical brighteners, release agents, chain transfer agents, other photopolymerizable monomers, and the like.

The photopolymerizable material preferably includes a stabilizer to prevent or reduce degradation which leads to property deterioration such as cracking and delamination after heat aging at 190° C. in air for 24 hrs. as defined by ASTM D 4538-90A and yellowing (coloration of greater than 8 on the Gardner Color Scale as determined by ASTM D 1544-80) after such heat aging. Such stabilizers include UV absorbers, light stabilizers, and antioxidants.

UV absorbers include hydroxyphenyl benzotriazoles, such as 2-[ 2-hydroxy-3,5-di(1,1-dimethylbenzyl)phenyl]-2-H-benzotriazole (Tinuvin 900); Poly(oxy-1,2-ethanediyl), α-(3-(3-(2H-benzyotriazol-2 -yl)-5-(1,1-dimethylethyl)-4-hydroxyphenyl)-1-oxopropyl)-ω-hydroxy (Tinuvin 1130); and 2-[2-hydroxy-3,5-di(1,1-dimethylpropyl)phenyl]-2 -H-benzotriazole (Tinuvin 238) and hydroxybenzophenones such as 4 -methoxy-2-hydroxybenzophenone and 4-n-octoxy-2-hydroxybenzophenone. Light stabilizers include hindered amines such as 4-hydroxy-2,2,6,6-tetramethylpiperidine, 4-hydroxy-1,2,2,6,6-pentamethylpiperidine, 4-benzoyloxy-2,2,6,6-tetramethylpiperidine, bis(2,2,6,6-tetramethyl-4-piperidinyl)sebacate (Tinuvin 770); bis(1,2,2,6, 6-pentamethyl-4-piperidinyl)sebacate (Tinuvin 292); bis(1, 2,2,6,6-pentamethyl-4-piperidinyl)-2-n-butyl-2-(3,5-di -tert-butyl -4-hydroxybenzyl)malonate (Tinuvin 144); and polyester of succinic acid with N-β-hydroxy-ethyl-2,2,6,6-tetramethyl-4-hydroxy-piperidine (Tinuvin 622). Antioxidants include substituted phenols such as 1,3,5 -trimethyl-2,4,6-tris(3,5-di-tert-butyl)-4-hydroxybenzyl)benzene, 1,1,3 -tris-(2-methyl-4-hydroxy-5-tert-butyl)phenyl)butane, 4,4'-butylidene -bis-(6-tert-butyl-3-methyl)phenol, 4,4'-thiobis-(6-tert-butyl-3-methyl)phenol, tris-(3,5-di-tert-butyl-hydroxybenzyl)isocyanurate, cetyl-3,5-di-tert-butyl-4-hydroxybenzene (Cyasorb UV2908); 3,5-di -tert-butyl-4-hydroxybenzoic acid, 1,3,5-tris-(tert-butyl-3-hydroxy-2,6-dimethylbenzyl) (Cyasorb 1790); stearyl-3-(3,5-di-tert-butyl-4-hydroxyphenyl)proprionate (Irganox 1076); pentaerythritol tetrabis(3,5 -di-tert-butyl-4-hydroxyphenyl) (Irganox 1010); and thiodiethylene-bis -(3,5-di-tert-butyl-4-hydroxy)hydrocinnamate (Irganox 1035).

The preferred stabilizers used in this invention are antioxidants. Preferred antioxidants are selected from substituted phenols such as 1,3,5-trimethyl-2,4,6-bis(3,5-di-tert-butyl)-4-hydroxybenzyl)benzene, 1,1,3-tris-(2-methyl-4-hydroxy-5-tert-butylphenyl)butane, 4,4' -butylidene-bis-(6-tert-butyl-3-methylphenol, 4,4'-thiobis-(6-tert-butyl-3-methylphenol, tris-(3,5-di-tert-butyl-4-hydroxybenzyl)isocyanurate, cetyl-3,5-di-tert-butyl-4-hydroxybenzene (Cyasorb UV 2908); 3,5-di -tert-butyl-4-hydroxybenzoic acid, 1,3,5-tris-tert-butyl-3-hydroxy-2,6-dimethylbenzyl) (Cyasorb 1790); stearyl-3-(3,5-di-tert-butyl-4-hydroxyphenyl)proprionate (Irganox 1076); pentaerythritol tetrabis(3,5 -di-tert-butyl-4-hydroxyphenyl) (Irganox 1010); and thiodiethylene-bis -(3,5-di-tert-butyl-4-hydroxy)hydrocinnamate (Irganox 1035). The most preferred stabilizers include pentaerythritol tetrabis(3,5-di-tert-butyl-4-hydroxyphenyl) (Irganox 1010); thiodiethylene-bis-(3,5-di-tert-butyl-4-hydroxy)hydrocinnamate (Irganox 1035); and stearyl-3-(3,5-di-tert -butyl-4-hydroxyphenyl)proprionate (Irganox 1076).

The amount of stabilizers in the composition may vary widely and is usually from about 0.1 to about 10 percent by weight of the photopolymerizable material. The amount of stabilizer is preferably from about 0.1 to about 5 percent by weight of the photopolymerizable material and more preferably from about 0.2 to about 3 percent by weight of the photopolymerizable material.

Cover plate 20 is then placed over photopolymerizable mixture 18 and pressed down until it is in contact with spacers 16 as illustrated in FIG. 5. Cover plate 20 comprises cover substrate 22 and release layer 24. Cover substrate 22 may be made of any material such as glass, quartz, fused silica, polymer sheet, or metal sheet. Release layer 24 may be a fluorinated polymer such as Teflon AF®, a polysiloxane, or an untreated polymer fill such as polyethylene terephthalate.

In another embodiment of the present process, waveguide substrate 2 is not used and the photopolymerizable material 18 is placed directly on photomask 8 (not illustrated).

Figure 6:
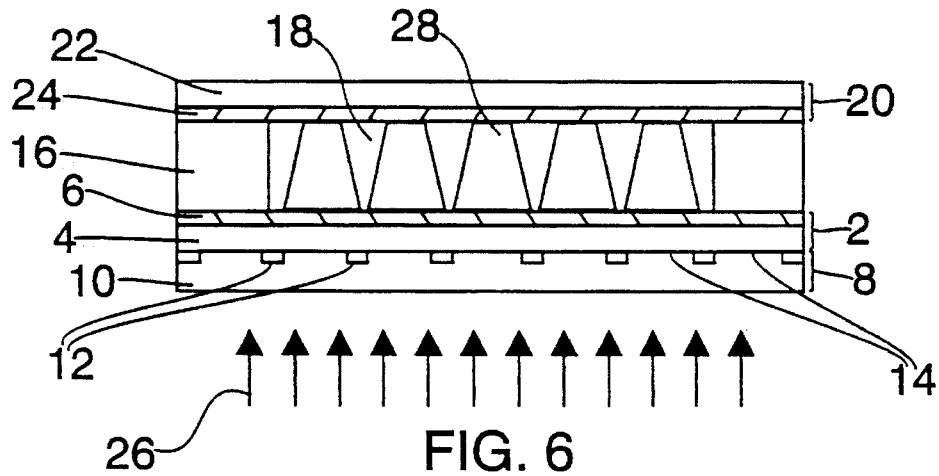
FIG. 6 illustrates exposure of the FIG. 5 combination to substantially collimated light.

In the next step of both embodiments of the present process, while maintaining the photopolymerizable mixture substantially stationary relative to the substantially collimated ultraviolet light, the photopolymerizable mixture is exposed through the transparent regions of the photomask to substantially collimated ultraviolet light for a time sufficient to form an array of tapered photopolymerized waveguides wherein: (i) the tapered end of each of the waveguides extends outward from the substrate or photomask, (ii) each of the waveguides has a light input surface adjacent the substrate or photomask and a light output surface distal from the light input surface, and (iii) the area of the light input surface of each of the waveguides is greater than the area of its light output surface. The assembly of FIG. 5 is then exposed to substantially collimated actinic radiation 26 as illustrated in FIG. 6. As used herein, the term "substantially collimated" means that the light which exits the light source does not diverge from the optical axis of the exposure system by more than 10 degrees.

The photopolymerizable material is exposed to actinic radiation of the required wavelength and intensity for the required duration. As used herein "actinic radiation" is defined as light in the visible, ultraviolet or infrared regions of the spectrum, as well as electron beam, ion or neutron beam or X-ray radiation. Actinic radiation may be in the form of incoherent light or coherent light, as for example light from a laser.

Sources of actinic light, and exposure procedures, times, wavelengths and intensities may vary widely depending on the desired degree of polymerization, the index of refraction of the photopolymer, and other factors known to those of ordinary skill in the art. Such conventional photopolymerization processes and their operational parameters are well known in the art. See for example in S. P. Pappas Ed. "Radiation Curing: Science and Technology" Plenum Press, New York, N.Y.; D. R. Randell Ed., "Radiation Curing of Polymers, II, Royal Society of Chemistry, Cambridge, Ma.; and C. E. Hoyle and J. F. Kristle, Ed., "Radiation Curing of Polymeric Materials", American Chemical Society. Accordingly, they will not be described herein in great detail.

Sources of actinic radiation and the wavelength of the radiation may vary widely, and any conventional wavelengths and sources may be used. It is preferable that the photochemical excitation be carded out with relatively short wavelength (or high energy) radiation so that exposure to radiation normally encountered before processing (e.g., room lights) will not prematurely polymerize the polymerizable material. Thus, exposure to ultraviolet light (300–400 nm wavelength) and exposure by deep ultraviolet light (190–300 nm wavelength) are preferred. Convenient sources are high pressure xenon or mercury-xenon arc lamps fitted with appropriate optical filters to select the desired wavelengths for processing. Also, short wavelength coherent radiation is useful for the practice of this invention. An argon ion laser operating in the "UV" mode at several wavelengths near 350 nm is desirable. Also, a frequency-doubled Argon ion laser with output near 257 nm wavelength is desirable. Electron beam or ion beam excitation may also be utilized. The most preferred actinic radiation is ultraviolet light in the 300–400 nm region, such as produced by a mercury, xenon, or mercury-xenon lamp.

Substantially collimated actinic radiation 26 passes through transparent regions 14 of photomask 8 and causes a photopolymerization reaction in the exposed regions 28 of photopolymerizable mixture 18 which align with the transparent regions 14 of the photomask 8 as illustrated in FIG. 6. No, or in some cases, only limited photoreaction occurs in those areas of photopolymerizable mixture 18 which are shielded from the substantially collimated actinic radiation 26 by opaque regions 12 of photomask 8.

In order that the exposed regions 28 have the proper tapered shape, the optical absorption of the photopolymerizable mixture 18 at the wavelengths of the ultraviolet light must be high enough such that a gradient of actinic radiation intensity is established through the film during actinic radiation exposure. That is, the amount of actinic radiation available in the photopolymerizable mixture 18 to cause the initiation of the photoreaction will decrease from the photomask 8 side towards the cover plate 20 side, due to the finite absorption of the photopolymerizable mixture 18. This gradient of actinic radiation causes a gradient in the amount of photopolymerization reaction that occurs across the thickness of photopolymerizable mixture 18, and this results in the unique tapered geometry of the developed waveguide structures, a geometry which is easily accessible with the process of the present invention.

The gradient in the amount of photopolymerization which occurs across the thickness of photopolymerizable mixture 18 may be further influenced by the presence of dissolved oxygen gas in the photopolymerizable mixture 18, such oxygen acting to curtail or quench the photopolymerization reaction except in those areas where all oxygen has been consumed by the free radicals produced in the photopolymerization process. Such action of dissolved. Oxygen gas on the progress of photopolymerization reactions is well known to those skilled in the art. Further, the requisite geometry of the photopolymer structures may be further influenced by the process of self-focusing. That is, the light falling on the surface of the photopolymerizable mixture 18 nearest the photomask 8 initiates photopolymerization at that surface, and since the refractive index of the solidified polymer material is higher than that of the liquid monomer, it acts to refract the light passing through it. In this manner, the aerial image of light falling on the photopolymerizable mixture nearer to the cover plate side of the layer is altered through refraction caused by the already-polymerized material which lies closer to the photomask. This effect may cause a narrowing of the resultant polymerized structure from the mask side, upon which the imaging light was directed, towards the cover plate 20.

Figure 7:
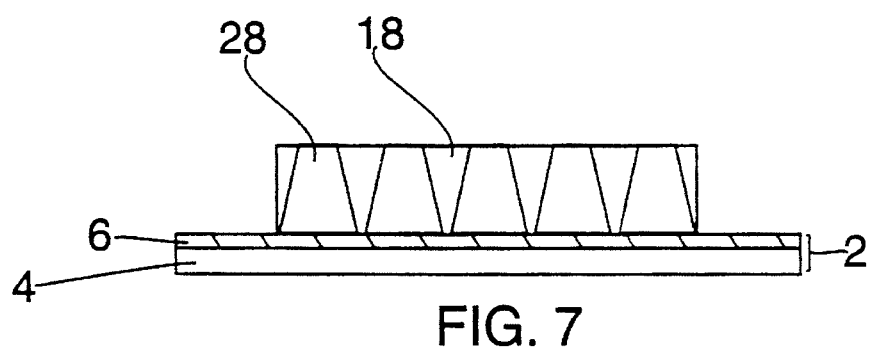
FIG. 7 illustrates the FIG. 6 combination after removal of the photomask and cover plate.
Figure 8:
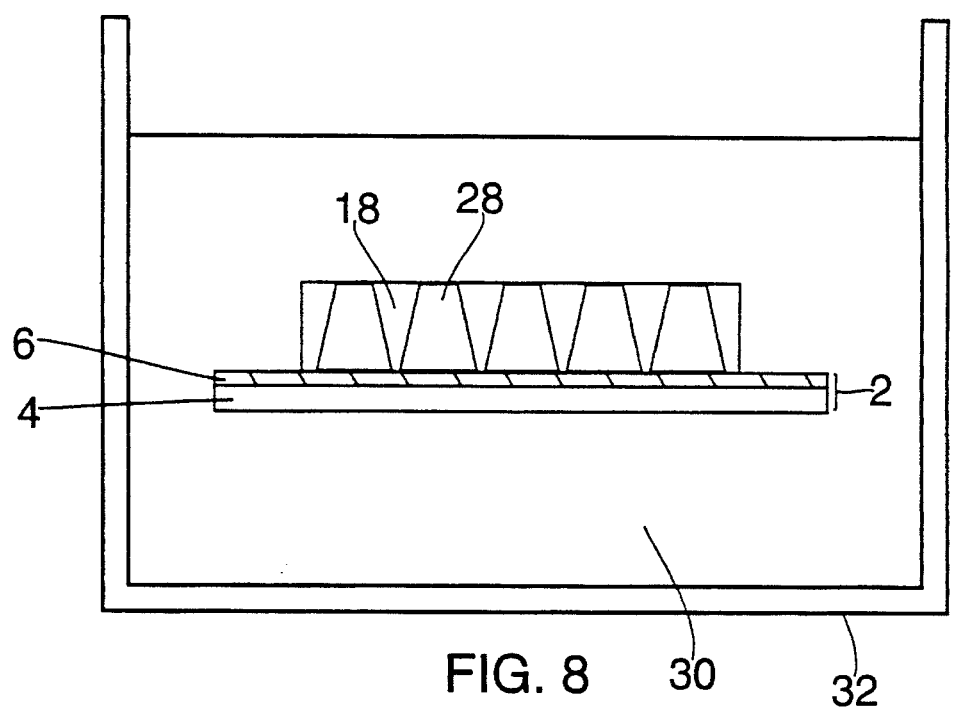
FIG. 8 illustrates the removal of unexposed polymerizable material from the FIG. 7 combination.
Figure 9:
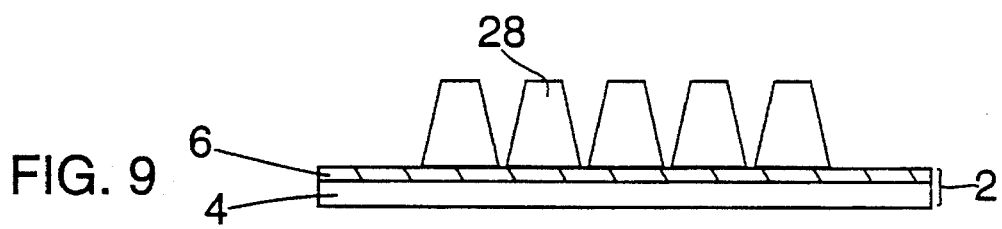
FIG. 9 illustrates the combination resulting from FIG. 8.
Figure 9A:
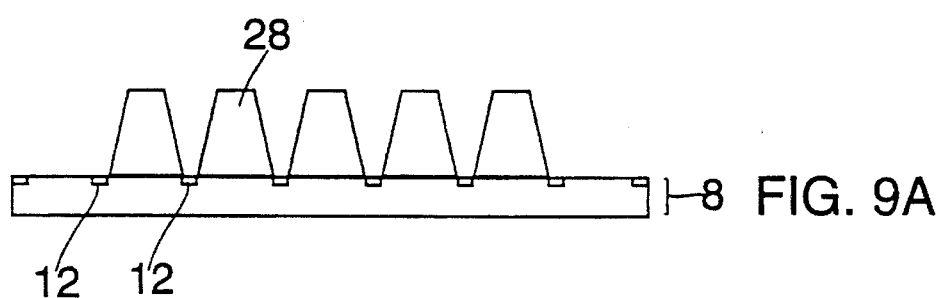
FIG. 9A illustrates the combination resulting from another embodiment of the present process.

In the last step of both embodiments of the present process, the photopolymerizable mixture which was unexposed to substantially collimated actinic radiation during the exposure step is removed. Photomask 8, spacers 16, and cover plate 20 with release layer 24 are removed as illustrated in FIG. 7. The unreacted monomers are washed away with a suitable solvent 30 such as acetone, methanol, or isopropanol in a container 32 as illustrated in FIG. 8 leaving a pattern of photopolymerized regions 28 on the waveguide substrate 2. Depending upon the monomers selected, it may be possible to use aqueous-based solvents. The remaining final structure in the first embodiment of the present invention consists of photopolymerized regions 28 on waveguide substrate 2 as illustrated in FIG. 9. In the other embodiment of the present invention, the pattern of photopolymerized regions 28 remains on photomask 8 as illustrated in FIG. 9A. The final structure containing the array of tapered photopolymerized waveguides 28 may receive an optional post-development flood exposure to ultraviolet light 34 as illustrated in FIG. 10 to further harden the photopolymer material.

In a commercial batch production line, the photomask and substrate, if used, may be contacted at a first station. This assembly is then advanced to a second station where a collimated ultraviolet light source is located. A photopolymerizable mixture is placed on the substrate or photomask and exposed through the transparent regions of the photomask to the substantially collimated actinic radiation. The exposed assembly is then advanced to a third station wherein the photomask and unexposed photopolymerzable mixture are removed.

In a commercial continuous production line, a photopolymerizable mixture may be extruded between a flexible substrate and flexible cover plate (not illustrated). This assembly then travels between two rollers wherein one roller comprises a photomask having opaque and transparent regions thereon and an actinic radiation source situated inside the roller. The photopolymerizable mixture is then exposed through the transparent regions of the photomask to the substantially collimated actinic radiation. The cover plate is then removed from the exposed assembly and the exposed assembly advances around another roller through a solvent bath to remove unexposed mixture.

Figure 10:
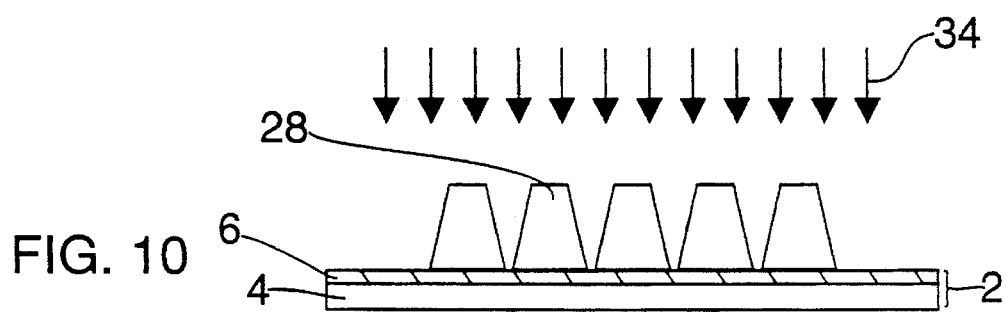
FIG. 10 illustrates the flood exposure of the FIG. 9 combination.
Figure 11:
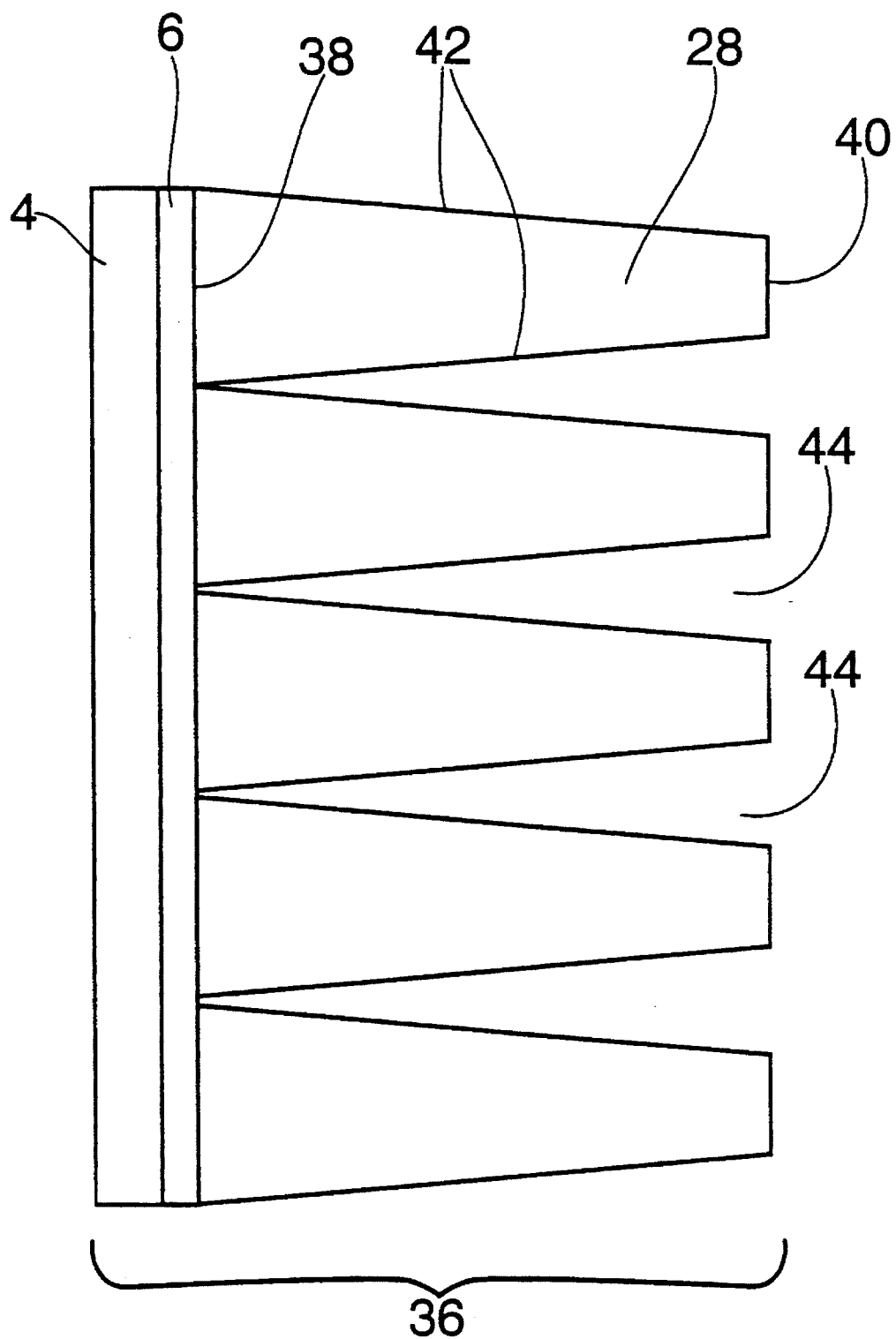
FIG. 11 is an exploded sectional view of an array of tapered waveguides with straight sidewalls made by the present process.

FIG. 11 shows an exploded sectional view of image display means 36 made of the array of tapered photopolymerized waveguides 28 shown in FIG. 10. The image display means 36 is composed of the substrate 4, adhesion promoting layer 6, and an array of tapered waveguides 28. The tapered waveguides 28 have a light input surface 38, light output surface 40, sidewalls 42 and are separated by interstitial regions 44 with a lower refractive index than the refractive index of the waveguides. Input surface area 38 of each tapered waveguide 28 is positioned adjacent to the adhesion promoting layer 6 and is larger than output surface area 40 of each waveguide 28, which results in a tapered structure. The structure and positioning of tapered waveguides 28 are critical.

As shown in FIG. 11, the area of light input surface 38 of each tapered waveguide 28 is greater than the area of its light output surface 40, and the center-to-center distance between light input surfaces 38 of adjacent waveguides 28 in the array is equal or substantially equal to the center-to-center distance between light output surfaces 40 thereof, so that the angular distribution of light emerging from light output surfaces 40 of waveguides 28 is larger than the angular distribution of light entering input surfaces 38 of waveguides 28. In order that the resolution of the image formed by a modulating means such as an LCD (not illustrated) not be degraded as it traverses image display means 36, it is preferred that the center-to-center distance between light input surfaces 38 of adjacent waveguides 28 is equal to or less than the center-to-center distance between adjacent pixels of the modulating means. In FIG. 11, sidewalls 42 are shown as straight. However, the shape of sidewalls 42 may be straight or curved.

Figure 12:
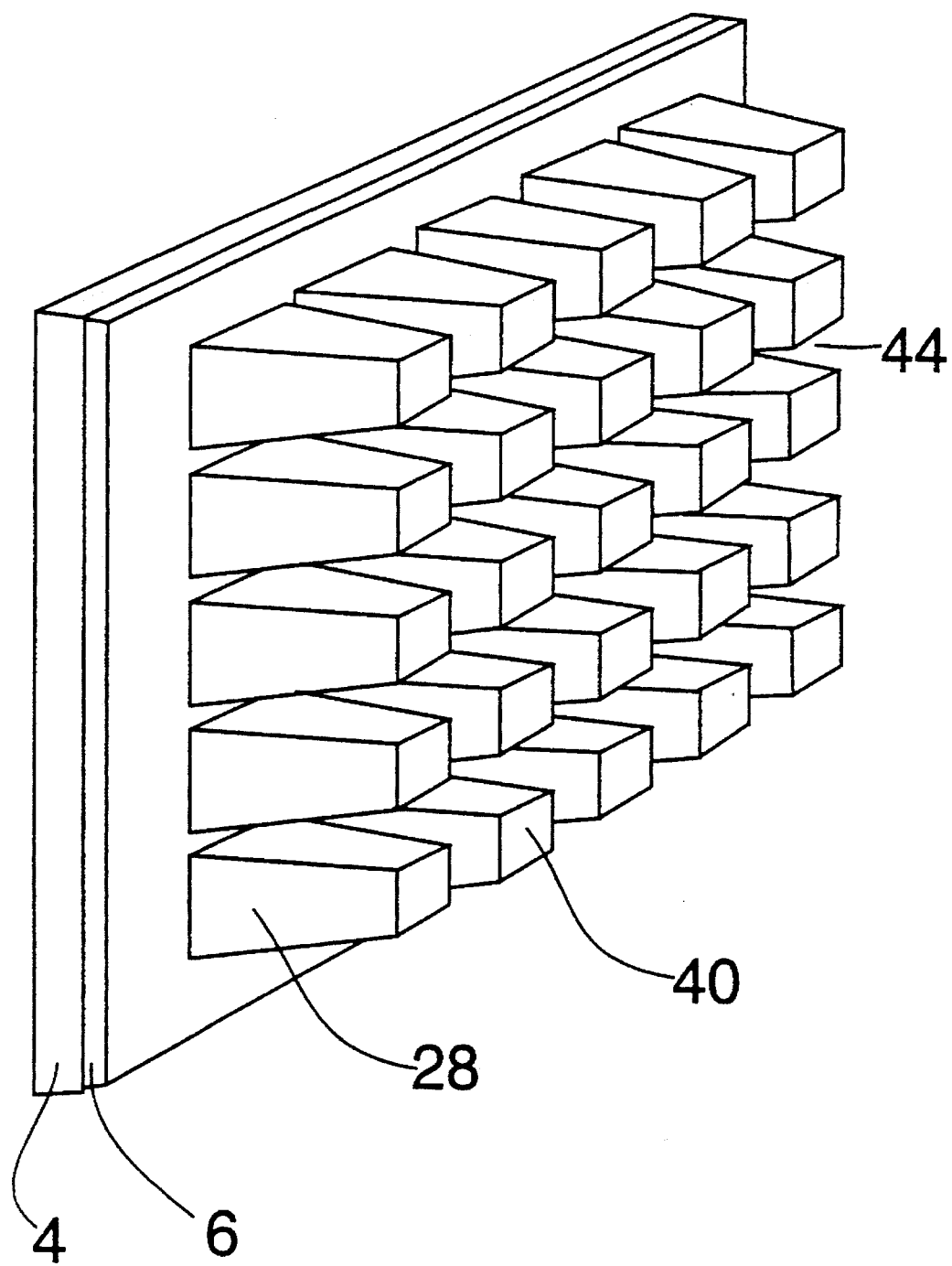
FIG. 12 is an array of tapered waveguides with rectangular cross-sections viewed in perspective made by the present process.
Figure 13:
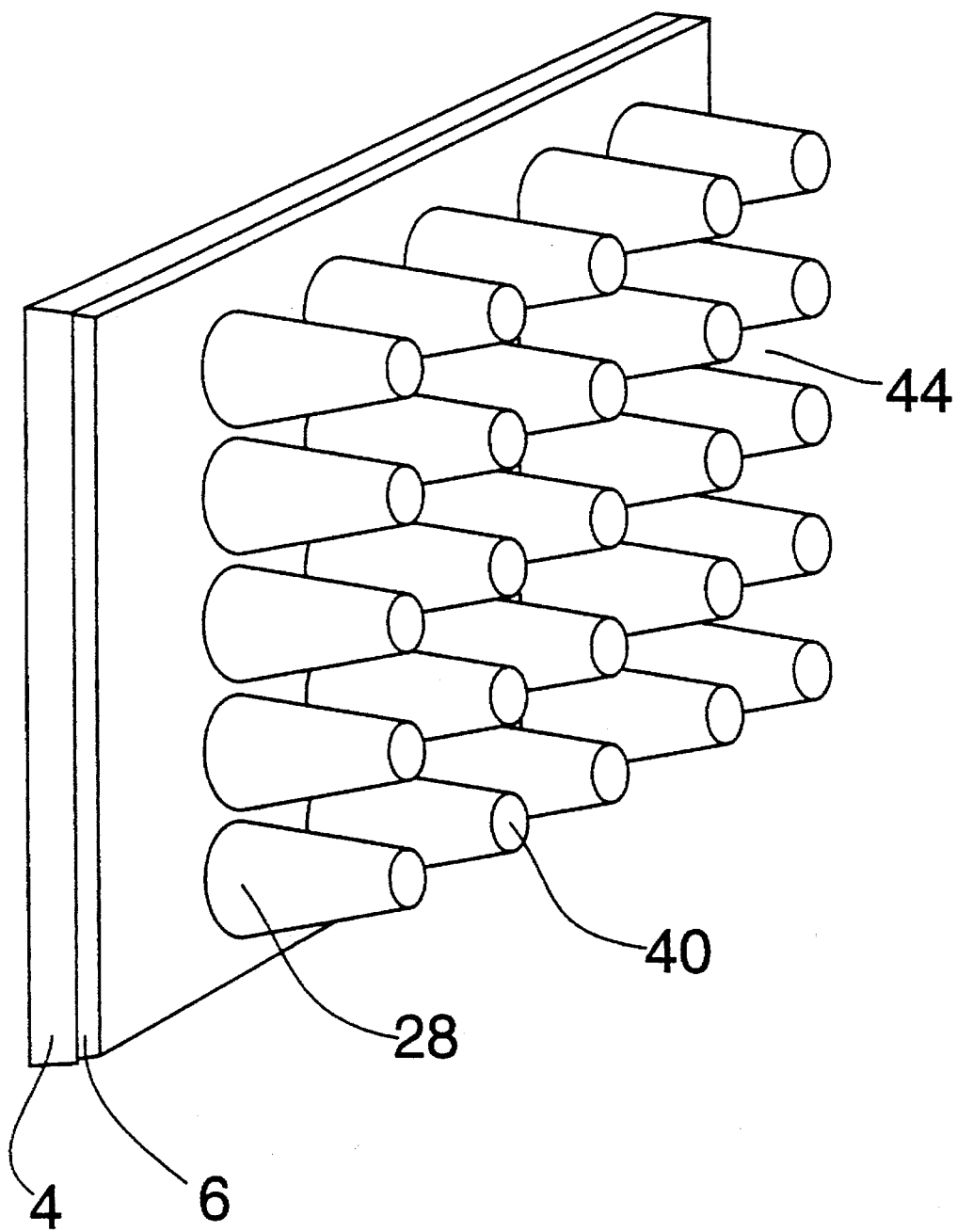
FIG. 13 is an array of tapered waveguides with round cross-sections viewed in perspective made by the present process.

The cross-section of a tapered waveguide 28 in a plane parallel to the surface of image display means 36 may have any shape including a square, a rectangle, any equilateral polygon, a circle, or an oval. FIG. 12 shows an array composed of tapered waveguides 28 with rectangular cross-sections viewed in perspective. FIG. 13 shows a similar view of an array composed of tapered waveguides 28 which have circular cross-sections. Examples of shapes for the entire waveguide 28 include right circular cones, right oval cones, right square pyramids, and right rectangular pyramids, any of which may be whole or truncated.

The optical properties, i.e. contrast and change in chromaticity as a function of viewing angle, of an array of tapered waveguides 28 are determined by the shape, size, and physical arrangement of the individual waveguides 28. In FIG. 11, the center-to-center distance between light input surfaces 38 of adjacent waveguides 28 is equal or substantially equal to the center-to-center distance between the light output surfaces 40 of adjacent waveguides 28. Therefore, an optical image entering the array at light input surfaces 38 will be neither magnified or demagnified after traversing the array.

The tapered optical waveguides 28 of the arrays shown in FIG. 11, FIG. 12, and FIG. 13 are formed from a transparent solid material having a higher index of refraction than interstitial regions 44 between the waveguides. Light rays which enter waveguide 28 through light input surface 38 (shown in FIG. 11) and thereafter are incident on sidewalls 42 of the wave guide at angles greater than the critical angle (as defined by Snell's Law) will undergo one or more total internal reflections from the sidewalls 42 and, in most cases, emerge from waveguide 28 through light output surface 40. A few light rays may pass through the sidewalls 42 or be reflected back to the light input surface 38. The operational function of tapered waveguide 28 differs from a lens in that a lens does not utilize total internal r-erection.

Since waveguide 28 has a taper such that the area of the light output surface 40 is smaller than the area of light input surface 38, the angular distribution of the light emerging from light output surface 40 will be larger than the angular distribution of the light entering the light input surface 38. Image display means 36 having an array of tapered waveguides 28 placed at the output surface of a modulating means will alter the angular distribution of output light from the modulating means such that the image from the modulating means may be viewed at higher angles. It is preferred that the area of light output surface 40 of each waveguide 28 be from about 1 to about 60 percent of the area of the light input surface 38. It is more preferred that the area of the light output surface 40 be from about 3 to about 40 percent of the area of the light input surface 38. It is most preferred that the area of light output surface 40 be from about 4 to about 20 percent of the area of light input surface 38.

In order that image display means 36 has high overall light throughput, it is preferred that the sum of the areas for all waveguide light input surfaces 38 be greater than 40 percent of the total area of substrate 4 of the array. It is more preferred that the sum of the areas for all waveguide light input surfaces 38 in image display means 36 be greater than 60 percent of the total area of substrate 4 of the array. It is most preferred that the sum of the areas for all waveguide light input surfaces 38 in image display means 36 be greater than 80 percent of the total area of substrate 4 of the array.

The index of refraction of interstitial region 44 between the tapered waveguides 28 must be less than the index of refraction of the tapered waveguides 28. Preferred materials for interstitial regions include air, with an index of refraction of 1.00, and fluoropolymer materials with an index of refraction ranging from about 1.30 to about 1.40. The most preferred material is air.

Figure 14:
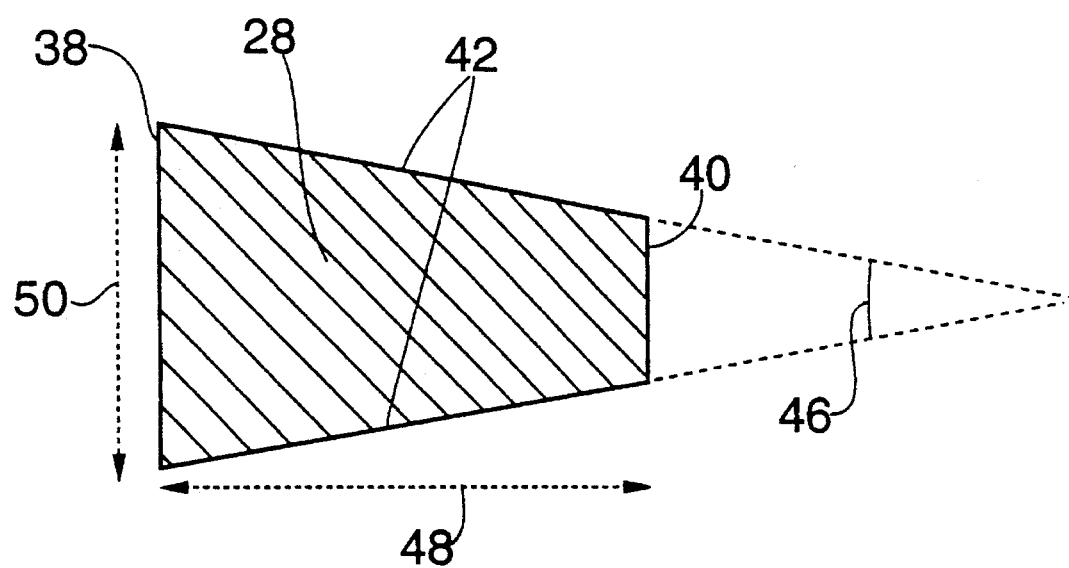
FIG. 14 is a sectional view of a single tapered waveguide with straight sidewalls made by the present process.

A single tapered waveguide 28 with light input surface 38, light output surface 40, and straight sidewalls 42 is shown in FIG. 14. If tapered straight sidewalls 42 in the drawing are extended until they intersect, they form taper angle 46. Desired values for taper angle 46 range from about 2 degrees to about 14 degrees. More preferred values for taper angle 46 range from about 4 degrees to about 12 degrees. Most preferred values for taper angle 46 are from about 6 degrees to about 10 degrees.

The length 48 of tapered waveguide 28 depends upon dimension 50 which is the minimum transverse distance across waveguide light input surface 38. For example, if light input surface 38 has the shape of a square, dimension 50 is the length of one side of the square. If light input surface 38 has a rectangular shape, dimension 50 is the smaller of the two side dimensions of the rectangle. The specific values for dimension 50 may vary widely depending on the center-to-center distance between adjacent pixels of a modulating means. In order that the resolution of the image formed by a modulating means not be degraded, dimension 50 should be equal to or less than the center-to-center distance between adjacent pixels of a modulating means. For example, if the center-to-center distance between adjacent pixels in a modulating means is 200 microns, then dimension 50 is generally in the range from about 5 microns to about 200 microns, more preferably from about 15 microns to about 200 microns, and most preferably from about 25 microns to about 100 microns.

Once dimension 50 is chosen, length 48 may be specified by the ratio of length 48 to dimension 50. The ratio of length 48 to dimension 50 may vary widely depending on how much one wishes to increase the angular distribution of light emerging from the light output surface 40 compared to the angular distribution of light entering input surface 38. The ratio of length 48 to dimension 50 is usually from about 0.25 to about 20. It is more preferred that the ratio of length 48 to dimension 50 be from about 1 to about 8. It is most preferred that the ratio of length 48 to dimension 50 be from about 2 to about 4.

Figure 15:
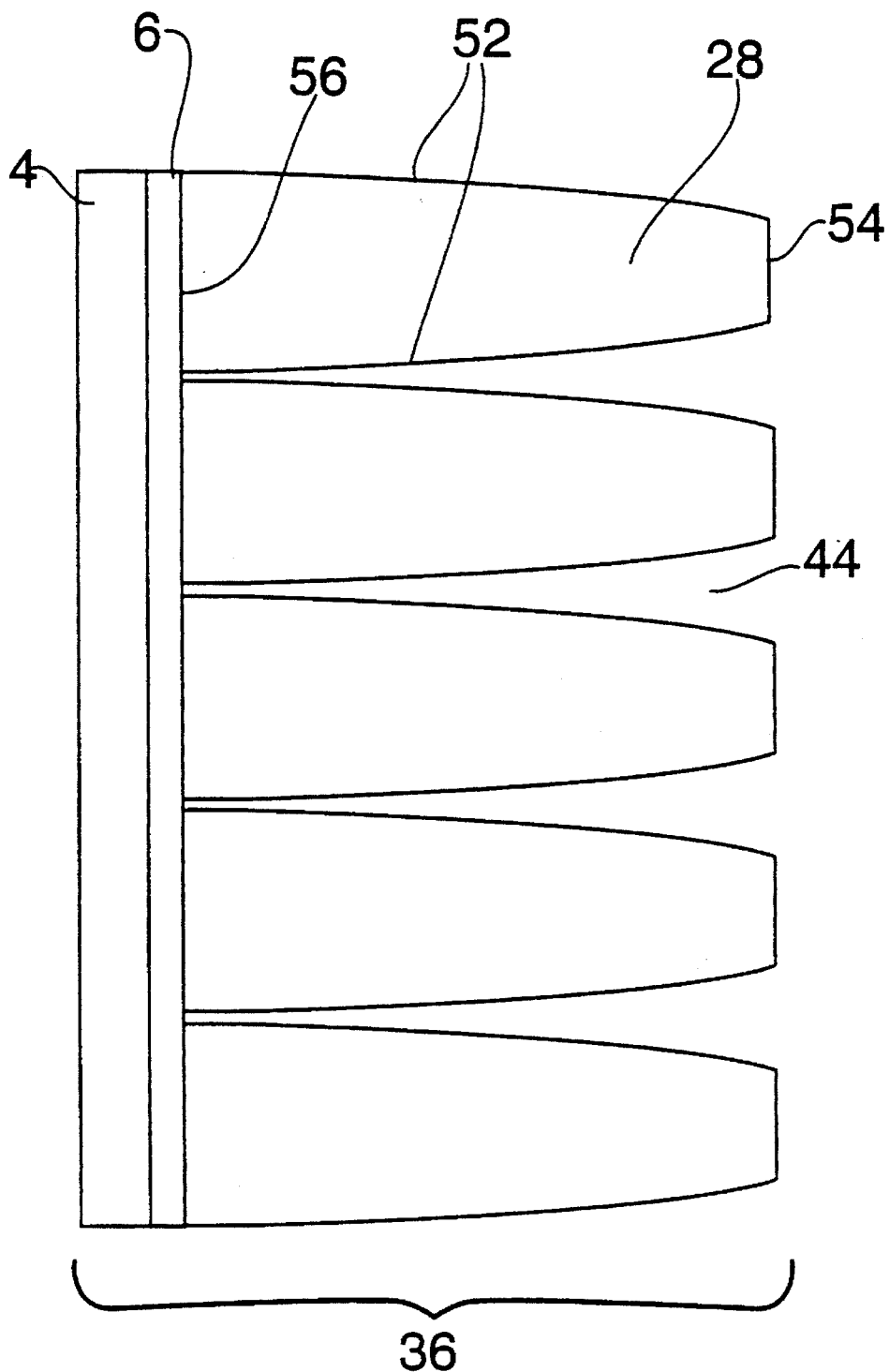
FIG. 15 is an exploded sectional view of an array of tapered waveguides with curved sidewalls made by the present process.

A further embodiment of the present invention is illustrated in FIG. 15. Image display means 36 is composed of a substrate 4, an adhesion promoting layer 6, and individual tapered waveguides 28. Waveguides 28 have curved sidewalls 52 instead of straight sidewalls as was shown in FIG. 11. The preferred relationships between the area of the light output surface 54 and the area of the light input surface 56 are the same as the preferred relationships previously stated for tapered waveguides 28 with straight sidewalls. In particular, it is preferred that the area of light output surface 54 of each waveguide 28 be from about 1 to about 60 percent of the area of light input surface 56. It is more preferred that the area of the light output surface 54 be from about 3 to about 40 percent of the area of light input surface 56. It is most preferred that the area of light output surface 54 be from about 4 to about 20 percent of the area of light input surface 56.

Figure 16:
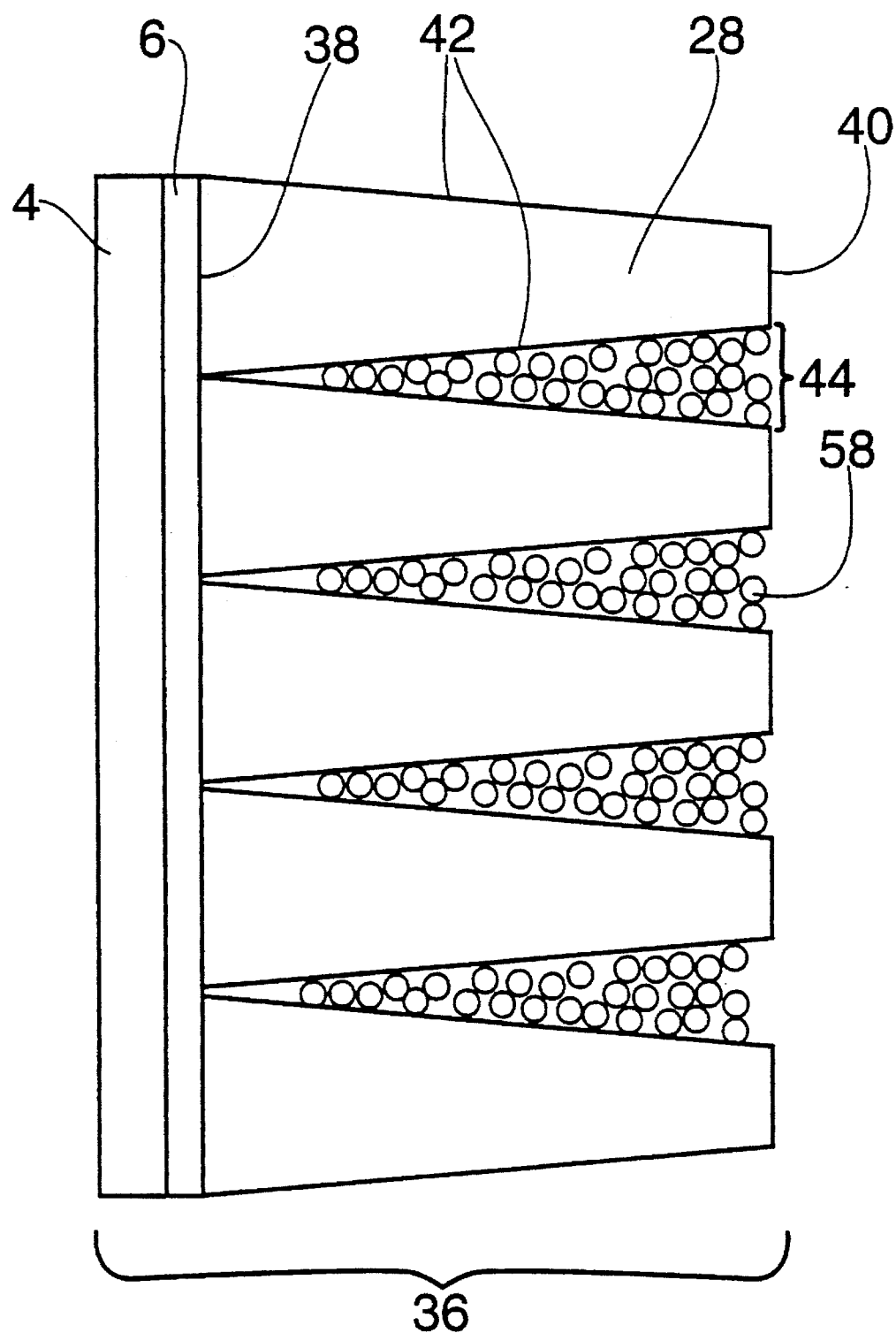
FIG. 16 shows an array of tapered waveguides made by the present process wherein the interstitial regions between waveguides contain a light absorptive black particulate amaterial.

A preferred embodiment of the present invention in which the interstitial regions 44 between tapered waveguides 28 are filled with a light absorptive material, as for example light absorptive black particulate material 58 is shown in FIG. 16. By utilizing a light absorptive material in interstitial regions 44, the direct view display device has higher contrast and less ambient light is reflected back to the observer. It is preferred that light absorptive particles 58 be used for the interstitial regions 44 rather than a continuous black material in order to minimize the area of black material in contact with sidewalls 42 of the waveguides. A continuous black material in interstitial regions 44 would result in excess absorption loss to light transmitted through waveguides 28. Any light :absorptive material can be used to form light absorptive black particles 58. These materials can be identified by a black color.

Examples of useful light absorptive black particulate material include carbon lampblack powder, mixture of carbon black and toner, arid mixture of carbon black and fluoropolymer. Looking at the light output side of an array of tapered photopolymerized waveguides, the light absorptive black particulate material causes the array to appear a dark matte black and provides good light transmission and little reflection.

In one embodiment, light absorptive black particulate material 58 is confined to interstitial regions 44 between waveguides 28 by using a low index polymer having light absorptive black particulate material therein. It is possible to make suspensions or emulsions of light absorptive black particulate material. In these cases, the carrier material for the black particles should preferably have an index of refraction less than the index of refraction of the individual tapered waveguides. This lower index filling material allows for total internal reflection (tir) of light propagating through the tapered waveguides to occur. It is more preferred that the index of refraction be at least 0.1 units less than the index of the preferred tapered waveguide material. It is most preferred that the index of refraction be 0.2 units or more less than the index of the preferred tapered waveguide material. For example, a suspension of amorphous teflon, such as Teflon AF® available from DuPont Corporation, and carbon lampblack powder in solvent may be coated onto an array of tapered photopolymerized waveguides. The solvent is then evaporated and the teflon acts as an optical buffer. In another example, an emulsion of fluoropolymer and carbon lampblack powder in water may be used. In another example, a low index fluorinated polyurethane resin mixed with carbon lampblack powder may be used. The light absorptive black particulate material mixtures are typically cured by heating or IR and after curing, the surface may be cleaned by buffing.

Figure 17:
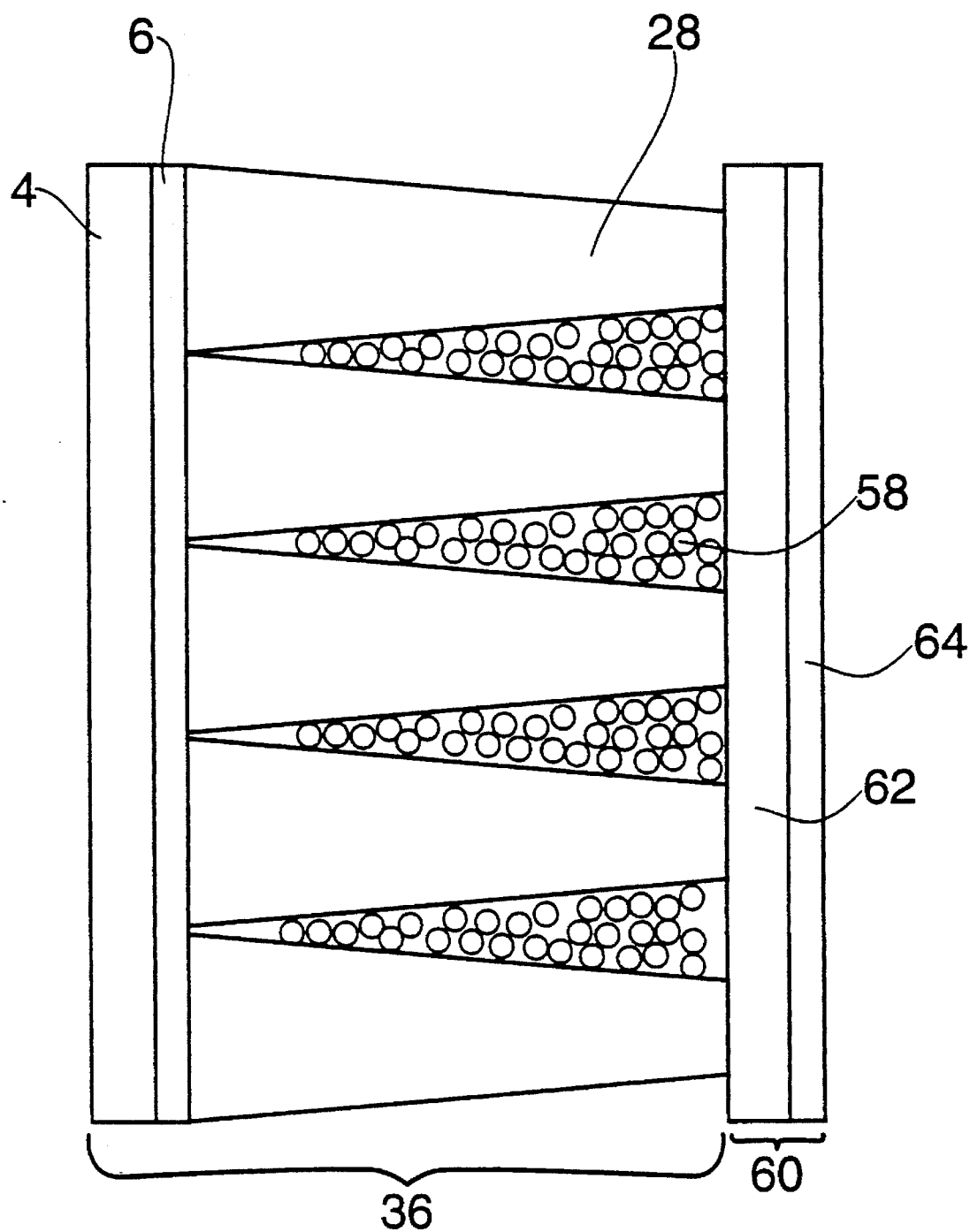
FIG. 17 shows an array of tapered waveguides made by the present process wherein the output faces of the waveguide array are covered by a transparent protective layer.

A further embodiment of the present invention as shown in FIG. 17 which incorporates protective layer 60 over output ends of the tapered waveguides 28. Protective layer 60 prevents mechanical damage to the output surfaces of waveguides 28 and also serves to confine light absorptive particulate material 58 to interstitial regions 44 between waveguides 28. Protective layer 60 may be an extruded or laminated overcoat. A protective layer may also be applied to the output surfaces of waveguides 28 before filling the interstitial regions 44 with a light absorptive black particulate material 58° Protective layer 60 is composed of a transparent backing material 62 as for example the material used to form substrate 4 and optionally and preferably anti-reflective film 64 formed from a material such as magnesium fluoride, which reduces specular reflections of ambient light from the surface of image display means 36. An anti-reflective coating may also be evaporated directly on the light output ends of the tapered waveguides 28 and interstitial regions 44. Examples of useful anti-reflective coatings are the fluoropolymers taught by commonly assigned U.S. Pat. Nos. 5,061,769; 5,118,579; 5,139,879; and 5,178,955 to Aharoni et al.

In FIG. 18, an embodiment of the present invention is illustrated which utilizes a protective layer 66 which includes an array of negative lenses 68. Each lens 68 is formed on substrate 70 and is aligned with the light output end 40 of tapered waveguide 28. Lens 68 is composed of a material with a lower refractive index than the overcoat layer 72. The advantage of incorporating an array of negative lenses with the image display means 36 is that the resulting display will have increased viewing angle.

The array of tapered waveguides produced by the present process may be used as image display means in the direct-view flat panel display devices of commonly assigned U.S. patent application Ser. No. 86,414 filed Jul. 1, 1993 which is incorporated herein by reference. Such display devices are used in computer terminals, televisions, airplane cockpit displays, automotive instrument panels, and other devices that provide text, graphics, or video information. In addition, the array of tapered waveguides produced by the present process may be used to alter or improve the optical characteristics of other information displaying means such as road signs, cathode ray tube (CRT) displays, dead from displays and other text, graphic or video information displays which do not fall in the category of flat panel devices, or to alter or improve the brightness or optical characteristics of lighting systems.

In an alternate method for commercial production, the photochemical manufacturing process described above may be used in small scale to produce tapered waveguide masters. The tapered waveguide master may then be used to create an inverted tapered waveguide mold. The process for making such an inverted tapered waveguide mold is well known to those skilled in the art (see e.g. Michael T. Gale et al., "Continuous-relief Diffractive Optical Elements for Two-dimensional Array Generation" in Applied Optics, Vol. 32, No. 14, p. 2526 (1993)). Typically, the mold is made by electroless depositing nickel metal. From this mold, further metal molds may be fabricated. Each successive mold generation provides the opposite profile polarity from the previous mold. Manufacture of the tapered waveguides may then be carded out by filling a mold of opposite profile polarity from the master with a photopolymerizable mixture and exposing the mixture with actinic radiation. The resulting structure is then separated from the mold and is a substantially exact replica of the original tapered waveguide master. The replicated structure can be made free standing or can be created on a substrate, such as glass or polyester film, by applying the substrate to the photopolymerizable mixture and mold before polymerization. A decision to employ the replica from a mold technique will be guided by the exact dimensions of the waveguide array being fabricated as well as the production scale. The subsequent steps described in this process can now be applied to either the original or replicated tapered waveguide arrays.

The following specific examples are presented to particularly illustrate the invention and should not be construed to place limitations thereon.

EXAMPLE I

The production of an array of tapered waveguides on a thin, plastic film was achieved and was most desirable because of both its thinness and economics. A photolithographically created mask (5"×5"×0.09") with a two-dimensional grid of 45 micron wide clear squares on 50 micron centers was used. The 5 micron wide spaces between squares were opaque to ultraviolet and visible radiation. Onto this mask a few drops of methanol were applied and then a 100 micron thick poly(ethylene terephthalate) (PET) film was pressed on. This PET film was prepared with an ultra-thin film surface treatment which renders it reactive and adherable to polymerizing monomer solution. Such surface-activated films were known to those skilled in the art. The surface tension of the methanol caused the film to mildly, but firmly adhere to the mask. The mask and the surface-activated PET film constituted the array substrate subassembly.

Onto a separate 5"×5"×0.25" blank glass plate was bonded a PET film using a pressure sensitive adhesive. This constituted the release film subassembly. The release film subassembly was placed film-side up on a black, metal platform containing threaded holes. Metal spacers, 1 cm×3 cm×200 microns thick, were placed around the edges on top of the release film. Approximately 1 milliliter of a photopolymerizable monomer solution was delivered to the center of the release film. This monomer solution consisted of 62 parts ethoxylated bisphenol A diacrylate; 31 parts trimethylolpropane triacrylate; 1 part pentaerythritol tetrabis(3,5-di-tert-butyl-4-hydroxyphenyl) (Irganox 1010) antioxidant; 2 parts $\alpha,\alpha$-dimethyloxy-$\alpha$-hydroxy acetophenone (Darocur 1173) photoinitiator; 2 parts benzidimethyl ketal (Irgacure 651) photoinitiator; and 2 parts of 50% 1-hydroxycyclohexyl phenyl ketone and 50% benzophenone (Irgacure 500) photoinitiator. The array substrate subassembly was then placed, PET film-side down on top of the monomer solution. A clear glass 5"×5"×0.25" plate was placed on top of this entire fabrication assembly and metal clamps and screws were used to fully and evenly compress the plates together resulting in a 200 micron thick monomer solution layer between the release film and the array substrate.

At this point the entire fabrication assembly was placed under the collimating lens of a ultraviolet/visible (UV-vis) radiation exposure system. The UV-vis system contained a 1000 Watt Mercury-Xenon lamp and delivered even, collimated, and homogeneous full-spectrum radiation with an intensity of 85 mW/cm$^2$ to the entire 5"×5" area of the fabrication assembly. The sample was irradiated for 0.76 seconds. The fabrication assembly was then disassembled and the PET film with the array of tapered optical waveguides now formed, but still covered with monomer solution in the interstitial regions between elements, was positioned upside-down in a bath of isopropanol and left for ten minutes. Isopropanol was a relatively poor solvent for the monomer but was advantageous since it allowed for the even and mild development of the optical waveguide elements' reflective walls. After removal of the residual monomer, the tapered optical waveguides were dried in a stream of nitrogen gas, placed in a a nitrogen gas-purged enclosure, and hard cured under the UV-vis radiation for an additional 20 seconds.

Electron microscopy and optical microscopy were used to evaluate the tapered optical waveguides. The individual optical waveguides were observed to have the shape of truncated right square pyramids. The elements were 200 microns tall. The width of the smaller, output surface of the optical waveguides was 20 microns. The reflective sidewalls were very smooth and joined together at a depth of 160 microns below the output surface face. The input surface of the waveguides was located at the interface between the 100 micron thick PET array substrate and the width of this input surface was 50 microns although, as described, the input surfaces were totally fused together in this example. The taper angle of the optical waveguides was thus 12 degrees.

EXAMPLE II

Example I above was taken as a starting point. The tapered optical waveguides were abundantly covered with carbon lampblack powder, an optically absorbing material. The lampblack powder had a average particle size much smaller than the 50 micron dimensions of the optical waveguides. The powder was then carefully smoothed into the interstitial regions of the array of tapered optical waveguides using a soft instrument, in this case a gloved finger. The excess was removed with the same instrument. The optical waveguides were so robust that the lampblack could be spread without causing visible damage. Looking at the output side of the tapered waveguide array, the lampblack caused the array to appear a dark, matte black. The percent of the visible surface area which was blackened was determined to be 85 percent.

A transmission measurement was carded out by passing a helium-neon laser beam with a gaussian mode shape and a 6 degree full divergence angle through the array of tapered optical waveguides. When the light propagated from the light input side towards the light output side of the waveguides, the transmission was 60%.

A further experiment was carried out on a separate array of tapered optical waveguides. Here half the array was filled with lampblack powder and the other half was filled with a black liquid epoxy. After the epoxy dried, the two samples were compared. The array area filled with lampblack when viewed from the light input side appeared very transmissive and the array exhibited a transmission of 60 percent from the light input side to the light output side. The array area filled with black epoxy when viewed from the light input side appeared much less transmissive and the array exhibited a transmission of about 15 percent from the light input side to the light output side. This showed that the choice of optically absorbing material was very critical in allowing light to propagate successfully through the array of tapered waveguides. Where the optically absorbing material was lampblack powder, the powder came in direct contact with only a small fraction of the surface area of the waveguide sidewalls and allowed the phenomenon of total internal reflection to proceed unimpeded. Light was transmitted through the waveguides by entering the input ends of the waveguides, reflecting off the side walls of the waveguides, and exiting through the output surfaces. When the optically absorbing material was a black epoxy, its index matched to the reflective sidewalls and caused the light to couple through the sidewalls and be absorbed by the optically absorbing material.

EXAMPLE III

Example II above was taken as a starting point. The array of tapered optical waveguides with interstitial regions filled with lampblack powder was laminated together with a piece of PET film prepared with a pressure sensitive adhesive. The pressure-sensitive adhesive formed an index matched interface with the output surface of the optical waveguides. The array of waveguides continued to show a transmission of 60 percent as in Example II above. The array of tapered optical waveguides was now fitted with a protective layer and was washed, flexed, and handled without damage to the waveguides and without loss of the powdery, optically absorptive material.

EXAMPLE IV

Example II above was taken as a starting point. The array of tapered optical waveguides with interstitial regions filled with lampblack powder was laminated together with a piece of plastic heat-activated lamination film, typically used to laminate identification cards. The laminating film formed an index matched interface with the output surface of the optical waveguides. The array of waveguides continued to show a transmission of 60 percent as in Example II above. The array of tapered optical waveguides was now fitted with a protective layer and was washed, flexed, and handled without damage to the waveguides and without loss of the powdery, optically absorptive material.

EXAMPLE V

Example IV above was taken as a starting point. When viewed from the light output surface, the laminated, protective film offered a continuous air-plastic interface which caused light from behind the viewer to be reflected back into the viewer's eye. The example was covered with a layer of the same photopolymerizable monomer solution as used in Example I above. On top of the array and monomer solution was then placed a glass plate with an anti-reflection coating. After curing the monomer solution with UV-vis radiation, the array of tapered optical waveguides with a protective, laminated plastic film, and a further anti-reflection coated glass plate was observed to appear much darker. This was due to the reduction in reflected spurious light reaching the newer's eyes.

EXAMPLE VI

Example IV above was taken as a starting point. The protected array of tapered optical waveguides with absorptive black material was placed in from of a helium-neon laser beam with a gaussian mode shape and a 6 degree full divergence angle. The laser beam propagated from the light input side to the light output side. The light output was then observed on a diffusive viewing screen to be transformed into a broad pattern. This pattern was analyzed using video frame grabbing instrumentation and computer software. Analysis showed that this array of tapered optical waveguides caused light to be transformed into a broad output pattern centered about the central laser beam spot. Due to the use of a single laser beam and the geometry of the waveguides, the output pattern contained four-fold symmetry and 8 spots of roughly equal intensity. The full angular distribution of the regions of maximum spot intensity was 40 degrees. The entire output pattern of the array of tapered waveguides showed a relatively smoothly decreasing variation in light output intensity over a full angle of about 60 degrees even though the laser beam input had only a 6 degree divergence.

A lambertian diffuser offered an object to test the absolute display characteristics of the array of tapered optical waveguides. The intensity of the light propagating collinearly with the laser beam was normalized to 1. At a full angle of 40 degrees, the array of tapered optical waveguides provided 50 percent of the intensity of the ideal lambertian diffuser. At a full angle of 60 degrees, the array of tapered optical waveguides provided 17 percent of the intensity of the ideal lambertian diffuser. It should be pointed out that the lambertian diffuser operates by a mechanism of intense scattering and transmitted only 47 percent of the light incident on one surface in the forward direction.

EXAMPLE VII

Example I was taken as a starting point. A blackfilling mixture was created by mixing 5 parts carbon lampblack (Degussa Corporation) with 20 parts Fluorolink-T, 80 parts Fluorolink-B (from Ausimont Corporation), and 0.005 parts hardener, dibutyl tin dilaurate. This fluorinated polyurethane mixture had an index of refraction of about 0.2 units less than the index of the photopolymer tapered waveguides. This mixture was then applied to the interstitial regions of the tapered waveguide array with a soft instrument, in this case a gloved finger. The excess was removed by using the same instrument and also was cleaned with blotter paper. The top surface of the cones were observed to be clear of the black mixture. The array of tapered optical waveguides with interstitial regions filled with the blackfilling mixture was then allowed to cure in an oven at 50 degrees Celsius for 2 hours.

Looking at the output side of the tapered waveguide array, the blackfilling mixture caused the array to appear a dark, matte black. The percent of the visible surface area which was blackened was determined to be 85 percent.

A transmission measurement was carried out by passing a helium-neon laser beam with a gaussian mode shape and a 6 degree full divergence angle through the array of tapered optical waveguides. When the light propagated from the light input side towards the light output side of the waveguides, the transmission was 57%.

What is claimed is:

1. A process comprising the steps of:
   (a) placing a photomask in substantial contact with a substrate wherein said photomask has opaque and transparent regions;
   (b) placing a substantially uniform thickness of photopolymerizable mixture on said substrate so that said substrate is positioned between said photopolymerizable mixture and said photomask wherein:
      (i) said photopolymerizable mixture comprises at least one reactive monomer and photoinitiator, and (ii) said photoinitiator is present in an amount sufficient to form a gradient of substantially collimated actinic radiation across the thickness of said photopolymerizable mixture during subsequent step (c);

(c) while maintaining said photopolymerizable mixture and substrate in a substantially fixed plane relative to said substantially collimated actinic radiation, exposing through said transparent regions of said photomask said photopolymerizable mixture to said substantially collimated actinic radiation for a time sufficient to form an array of tapered photopolymerized waveguides wherein:

(i) the tapered end of each of said waveguides extends outward from said substrate, (ii) each of said waveguides has a light input surface adjacent said substrate and a light output surface distal from said light input surface, and (iii) the area of the light input surface of each of said waveguides is greater than the area of its light output surface; and (d) removing said photomask and photopolymerizable mixture which was not substantially polymerized by said substantially collimated actinic radiation during step (c) from said substrate.

2. The process of claim 1 wherein after step (b), a cover plate is placed on said substantially uniform thickness of photopolymerizable mixture.

3. The process of claim 1 which additionally comprises:

(e) applying light absorptive material to said array of tapered photopolymerized waveguides.

4. The process of claim 1 wherein said actinic radiation is ultraviolet light.

5. The process of claim 1 wherein said monomer is selected from the group consisting of methyl methacrylate, n-butyl acrylate, 2-ethylhexyl acrylate, isodecyl acrylate, 2-hydroxyethyl acrylate, 2-hydroxypropyl acrylate, cyclohexyl acrylate, 1,4-butanediol diacrylate, ethoxylated bisphenol A diacrylate, neopentylglycol diacrylate, diethyleneglycol diacrylate, diethylene glycol dimethacrylate, 1,6-hexanediol diacrylate, trimethylol propane triacrylate, pentaerythritol triacrylate, pentaerythritol tetra-acrylate, and mixtures thereof.

6. The process of claim 1 wherein said monomer is a mixture of ethoxylated bisphenol A diacrylate and trimethylol propane triacrylate.

7. The process of claim 1 wherein said photoinitiator is selected from the group consisting of benzidimethyl ketal; α,α-diethyloxy acetophenone; α,α-dimethyloxy-α-hydroxy acetophenone; 50% 1-hydroxycyclohexyl phenyl ketone and 50% benzophenone; 1-hydroxycyclohexyl-phenyl ketone; 1-[4-(2-hydroxyethoxy)phenyl]-2-hydroxy -2-methyl-propan-1-one; 2-methyl-1-4-(methylthio)phenyl]-2 -morpholino-propan-1-one; and 2-benzyl-2-dimethylamino-1-(4 -morpholinophenyl)butan-1-one.

8. The process of claim 1 wherein said photoinitiator is selected from the group consisting of benzidimethyl ketal; α,α-dimethyloxy-α-hydroxy acetophenone; 50% 1-hydroxycyclohexyl phenyl ketone and 50% benzophenone; 1-hydroxy-cyclohexyl-phenyl ketone; and 1-[4-(2-hydroxyethoxy)phenyl] -2-hydroxy-2-methyl-propan-1-one.

9. The process of claim 1 wherein said photoinitiator is present in an amount from about 0.5 to about 12 percent by weight based on the total weight of said photopolymerizable mixture.

10. The process of claim 1 wherein said photoinitiator is present in an amount from about 0.5 to about 8 percent by weight based on the total weight of said photopolymerizable mixture.

11. A process comprising the steps of:

(a) placing a substantially uniform thickness of photopolymerizable mixture on a photomask wherein:

(i) said photomask has opaque and transparent regions, (ii) said photopolymerizable mixture comprises at least one reactive monomer and photoinitiator, and (iii) said photoinitiator is present in an amount sufficient to form a gradient of substantially collimated actinic radiation across the thickness of said photopolymerizable mixture during subsequent step (b);

(b) while maintaining said photopolymerizable mixture and photomask in a substantially fixed plane relative to said substantially collimated actinic radiation, exposing through said transparent regions of said photomask said photopolymerizable mixture to said substantially collimated actinic radiation for a time sufficient to form an array of tapered photopolymerized waveguides wherein:

(i) the tapered end of each of said waveguides extends outward from said photomask, (ii) each of said waveguides has a light input surface adjacent said photomask and a light output surface distal from said light input surface, and (iii) the area of the light input surface of each of said waveguides is greater than the area of its light output surface; and (c) removing photopolymerizable mixture which was not substantially polymerized by said substantially collimated actinic radiation during step (b) from said photomask.

12. The process of claim 11 wherein after step (a), a cover plate is placed on said substantially uniform thickness of photopolymerizable mixture.

13. The process of claim 11 which additionally comprises:

(d) applying light absorptive material to said array of tapered photopolymerized waveguides.

14. The process of claim 11 wherein said actinic radiation is ultraviolet light.

15. The process of claim 11 wherein said monomer is selected from the group consisting of methyl methacrylate, n-butyl acrylate, 2-ethylhexyl acrylate, isodecyl acrylate, 2-hydroxyethyl acrylate, 2-hydroxypropyl acrylate, cyclohexyl acrylate, 1,4-butanediol diacrylate, ethoxylated bisphenol A diacrylate, neopentylglycol diacrylate, diethyleneglycol diacrylate, diethylene glycol dimethacrylate, 1,6-hexanediol diacrylate, trimethylol propane triacrylate, pentaerythritol triacrylate, pentaerythritol tetra-acrylate, and mixtures thereof.

16. The process of claim 11 wherein said monomer is a mixture of ethoxylated bisphenol A diacrylate and trimethylol propane triacrylate.

17. The process of claim 11 wherein said photoinitiator is selected from the group consisting of benzidimethyl ketal; α,α-diethyloxy acetophenone; α,α-dimethyloxy-α-hydroxy acetophenone; 50% 1-hydroxycyclohexyl phenyl ketone and 50% benzophenone; 1 -hydroxy-cyclohexyl-phenyl ketone; 1-[4-(2-hydroxyethoxy)phenyl]-2 -hydroxy-2-methyl-propan-1-one; 2-methyl-1-4-(methylthio)phenyl]-2 -morpholino-propan-1-one; and 2-benzyl-2-dimethylamino-1-(4 -morpholinophenyl)butan-1-one.

18. The process of claim 11 wherein said photoinitiator is selected from the group consisting of benzidimethyl ketal; α,α-dimethyloxy- α-hydroxy acetophenone; 50% 1-hydroxycyclohexyl phenyl ketone and 50% benzophenone; 1-hydroxy-cyclohexyl-phenyl ketone; and 1-[4-(2-hydroxyethoxy)phenyl]-2-hydroxy-2-methyl -propan-1-one.

19. The process of claim 11 wherein said photoinitiator is present in an amount from about 0.5 to about 12 percent by weight based on the total weight of said photopolymerizable mixture.

20. The process of claim 11 wherein said photoinitiator is present in an amount from about 0.5 to about 8 percent by weight based on the total weight of said photopolymerizable mixture.

* * * * *